United States Patent
Liao et al.

(10) Patent No.: US 12,020,993 B2
(45) Date of Patent: Jun. 25, 2024

(54) TEST STRUCTURE AND TESTING METHOD THEREOF

(71) Applicant: TAIWAN SEMICONDUCTOR MANUFACTURING COMPANY LTD., Hsinchu (TW)

(72) Inventors: Chun Hao Liao, Hsinchu (TW); Yu Chuan Liang, Hsinchu (TW); Chu Fu Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 640 days.

(21) Appl. No.: 17/199,119

(22) Filed: Mar. 11, 2021

(65) Prior Publication Data

US 2022/0293477 A1    Sep. 15, 2022

(51) Int. Cl.
  *H01L 21/66* (2006.01)
  *H01L 21/266* (2006.01)
  *H01L 21/8234* (2006.01)
  *H01L 23/00* (2006.01)
  *H01L 27/085* (2006.01)

(52) U.S. Cl.
  CPC ............ *H01L 22/14* (2013.01); *H01L 21/266* (2013.01); *H01L 22/32* (2013.01); *H01L 24/03* (2013.01); *H01L 24/06* (2013.01); *H01L 2224/06515* (2013.01)

(58) Field of Classification Search
  CPC ......... H01L 22/34; H01L 22/14; H01L 22/20; H01L 2223/54453
  See application file for complete search history.

(56) References Cited

U.S. PATENT DOCUMENTS

| | | | | |
|---|---|---|---|---|
| 6,150,669 A * | 11/2000 | Nandakumar | ......... | H01L 22/34 257/401 |
| 6,165,807 A * | 12/2000 | Lee | ......... | H01L 22/34 438/18 |
| 6,603,162 B1 * | 8/2003 | Uchiyama | ......... | H01L 27/0207 257/E23.179 |
| 7,772,867 B2 * | 8/2010 | Guldi | ......... | H01L 22/20 324/762.05 |
| 2003/0006795 A1 * | 1/2003 | Asayama | ......... | H01L 22/34 324/750.3 |
| 2003/0030075 A1 * | 2/2003 | Yamaguchi | ......... | G06F 30/39 438/129 |

(Continued)

*Primary Examiner* — Anthony Ho
*Assistant Examiner* — David J Goodwin
(74) *Attorney, Agent, or Firm* — WPAT LAW; Anthony King

(57) ABSTRACT

A method includes: providing a substrate defining a scribe line region and a device region adjacent to the scribe line region; depositing a first mask layer over the device region and the scribe line region; patterning the first mask layer to define a plurality of first areas in the device region and a plurality of second areas in the scribe line region, wherein the first areas and the second areas are parallel and extending in a first direction from a top-view perspective; performing a first ion implantation to form first well regions in the first areas and second well regions in the second areas; coupling conductive pads to the second well regions; and performing a test on the second well regions through the conductive pads.

20 Claims, 20 Drawing Sheets

(56) References Cited

U.S. PATENT DOCUMENTS

| | | | |
|---|---|---|---|
| 2005/0085032 A1* | 4/2005 | Aghababazadeh | ................................ G01R 31/2831 438/232 |
| 2007/0257258 A1* | 11/2007 | Ikoma | ..................... H01L 22/34 257/48 |
| 2009/0020755 A1* | 1/2009 | Chung | ..................... H01L 22/34 257/E27.06 |
| 2009/0020756 A1* | 1/2009 | Lee | ..................... H01L 22/34 257/E23.002 |
| 2012/0181615 A1* | 7/2012 | Shimizu | ..................... H01L 22/34 257/E21.531 |
| 2017/0194219 A1* | 7/2017 | Ji | ..................... H01L 22/14 |
| 2020/0161195 A1* | 5/2020 | Hsu | ..................... H01L 27/0207 |

* cited by examiner

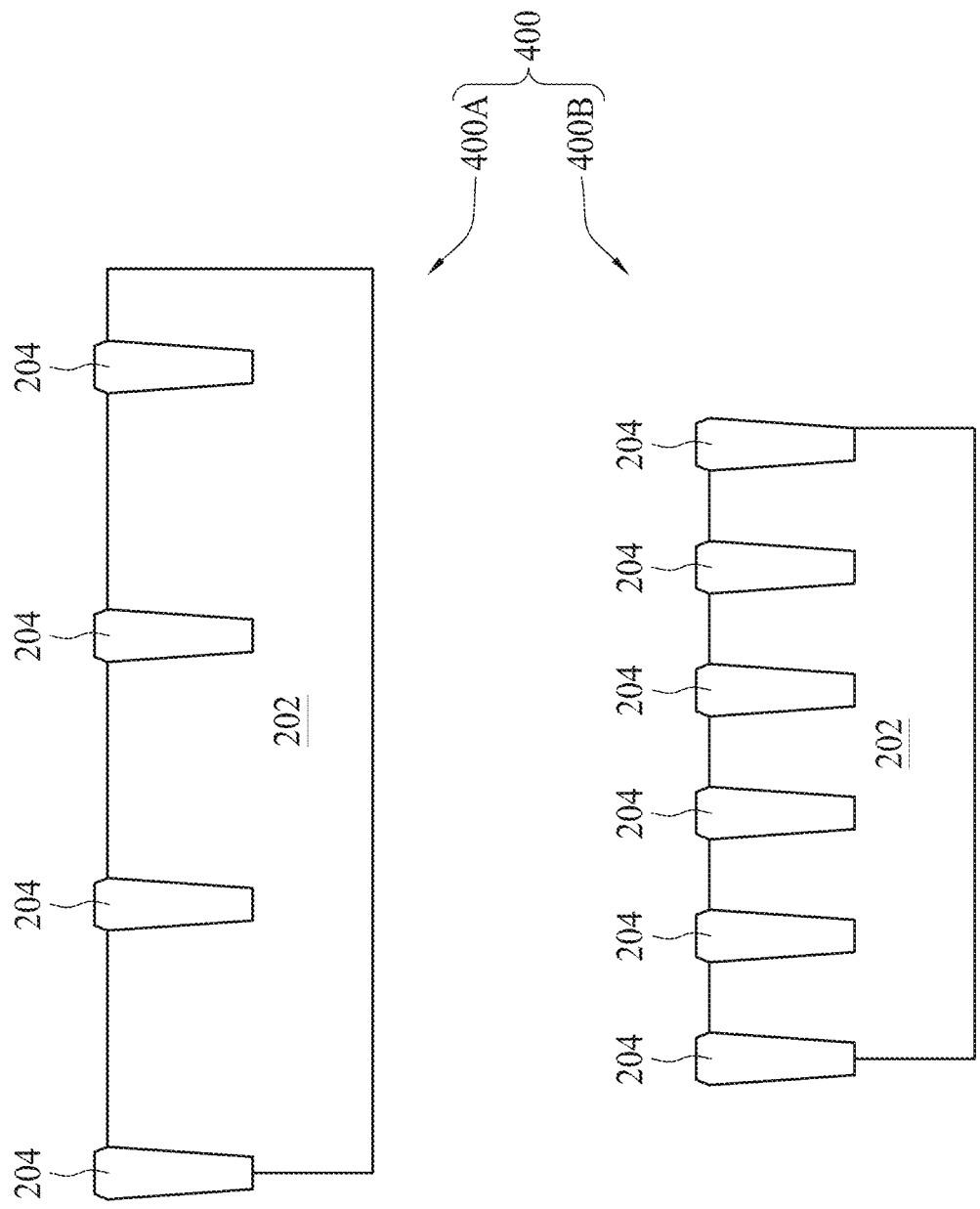

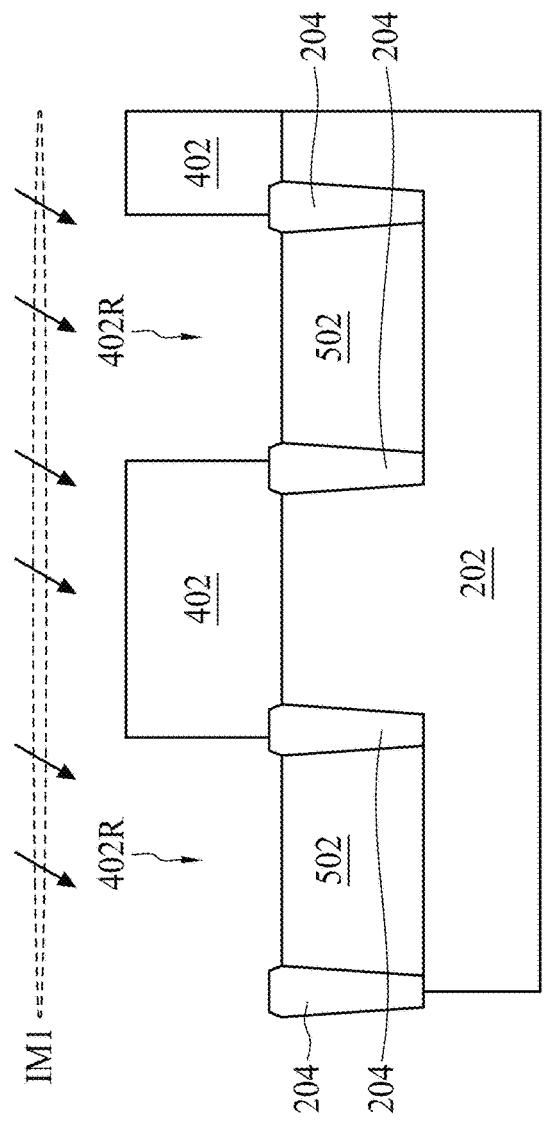
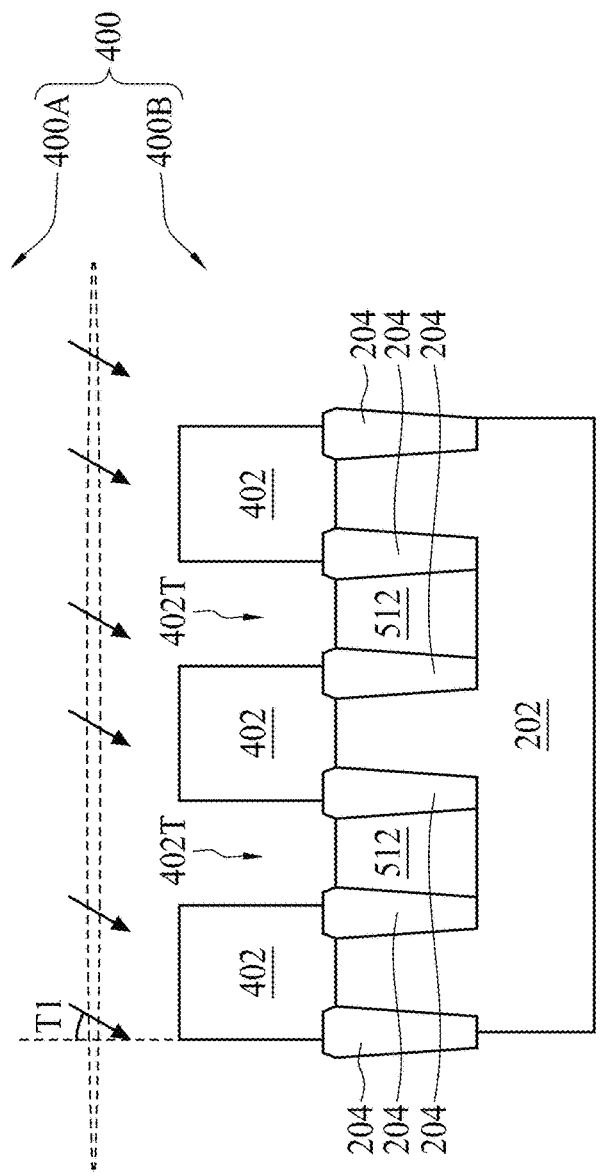
FIG. 6A
FIG. 6B

TEST STRUCTURE AND TESTING METHOD THEREOF

BACKGROUND

As technologies evolve, design and manufacturing of semiconductor devices become more complicated in view of smaller dimensions, increased functionality and more complicated circuitries. Numerous manufacturing operations are implemented within such small and high-performance semiconductor devices. Therefore, there is a continuous need to modify the structure and method of testing and manufacturing for the semiconductor devices in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A and 17B are schematic cross-sectional views showing intermediate stages of fabricating and testing the semiconductor wafer shown in FIG. 1, in accordance with some embodiments.

DETAILED DESCRIPTION

Figure 1:
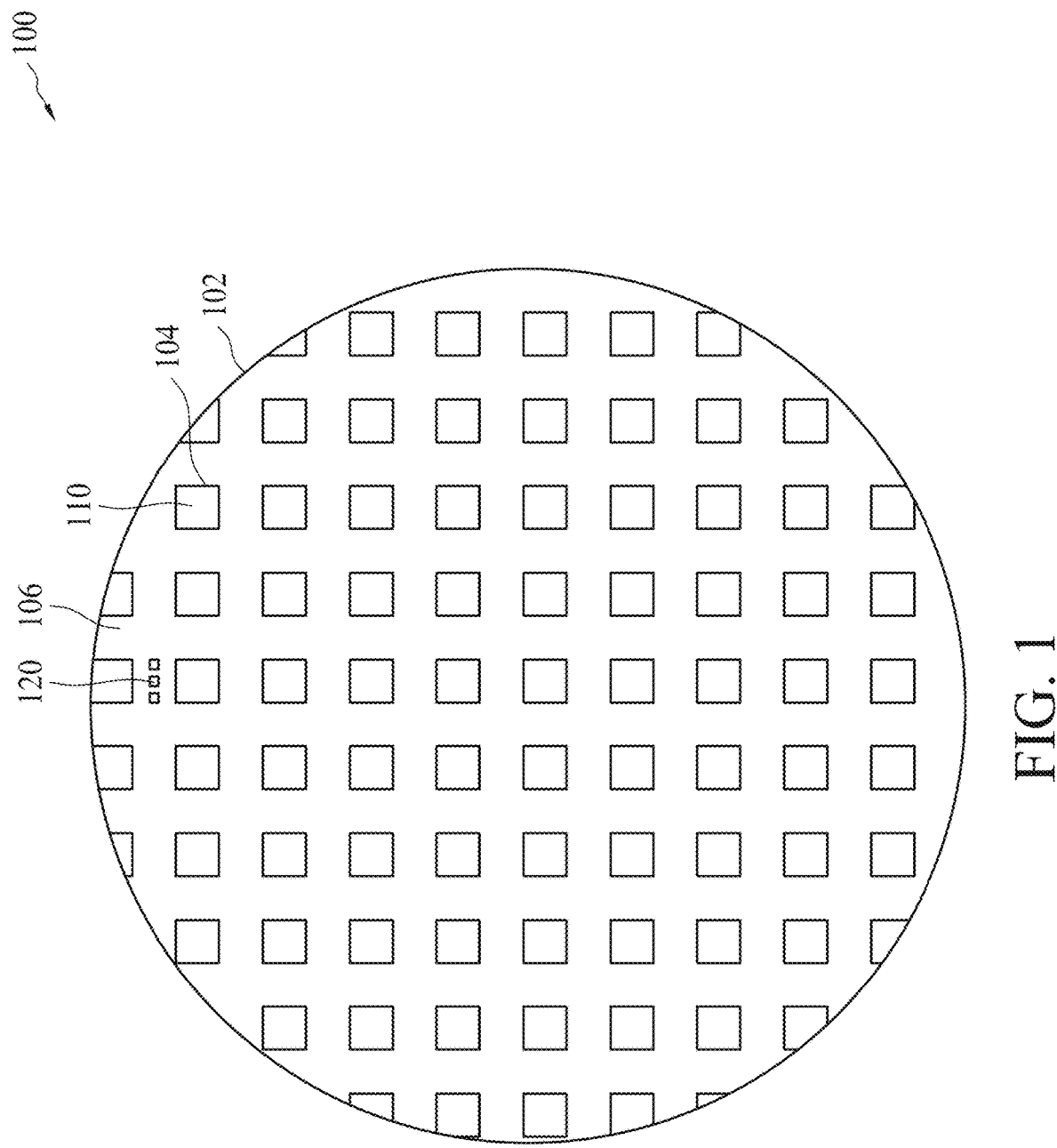
FIG. 1 is a schematic diagram showing a semiconductor wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to the field of semiconductor devices, and relates more particularly to the design of test structures on semiconductor wafers and the associated wafer-level testing methods for the purpose of manufacturing of semiconductor devices before they are separated into individual dies or chips.

When a semiconductor wafer is fabricated, the wafer defines an array of device regions. When semiconductor devices are completed on the device regions or in an intermediate stage of the fabrication process, these semiconductor devices need to be tested for ensuring that the fabrication processes conform to the design specification. Various test structures may be selected and used for different test subjects, such as a voltage or a current in a transistor. When circuit defects are detected in the test structures during early stages of the fabrication process via the test structures, it is indicated that the features in the semiconductor devices in the device regions may contain defects similar to the defective test structures. The semiconductor wafer may be subjected to further inspection or examination, or may be discarded from the production line to save fabrication cost and time.

The present disclosure discusses an improved test structure and an associated testing method for improving the test performance. The proposed test structure includes features designed to match their counterpart features in the device regions so that the testing result on the test structure may better identify potential defects in the device regions. The proposed test structure is effective in examining the breakdown voltages of the doped regions in high-voltage applications. As a result, fault detection can be performed more efficiently and the production cost and time can be saved accordingly.

FIG. 1 is a schematic diagram showing a semiconductor wafer 100, in accordance with some embodiments. In some embodiments, the semiconductor wafer 100 has a circular shape. During operation, the semiconductor wafer 100 may be held by a wafer stage or a chuck (not shown) and subjected to a processing operation or a testing operation in a processing chamber.

The semiconductor wafer 100 defines a plurality of device regions 104 arranged in an array or a matrix on a substrate 102. Each of the device regions 104 may correspond to a semiconductor die after the manufacturing process is completed. Each of the device regions 104 may include one or more semiconductor devices 110, which are formed of various functional components, for example, transistors, diodes, capacitors, inductors, resistors, dielectric layers, semiconductor layers, or conductive interconnects, formed around a surface of the semiconductor wafer 100. During operation, each of the device regions 104 may include completed or incomplete semiconductor devices 110 subjected to a testing operation.

A scribe line region 106 is defined between adjacent device regions 104. The scribe line region 106 includes intersecting columns and rows to serve as scribe lines in a singulation operation. After the fabrication and testing processes of the semiconductor devices 110 in the device regions 104 are completed, the device regions 104 are singulated into individual chips or dies through the scribe line region 106.

The scribe line region 106 may contain one or more test structures 120. Referring to FIG. 1, an exemplary test structure 120 is shown in the scribe line region 106. In an embodiment, the test structure 120 is formed in the scribe line region 106 to serve as a stand-alone circuit and is physically and electrically separated from the semiconductor devices 110 in the device regions 104. The materials, configuration, and parameters of forming for the test structure 120 may be determined as close to those of the semiconductor devices 110 as possible so as to reflect the geometrical properties and electrical performance of the semiconductor devices 110. In an embodiment, the shapes and geometries of the test structure 120 are determined to conform to the design rules for fabricating the semiconductor devices 110 in the device region 104.

In an embodiment, during the semiconductor fabrication process, every processing step is performed across the entire semiconductor wafer 100 so that various test structures 120 are also formed in the scribe line region 106 according to the same processes as those fabricating the semiconductor devices 110. Because the fabrication steps and materials for forming the semiconductor devices 110 and the test structures 120 are nearly identical, a defect found in the test structure 120 is likely to be found in the semiconductor devices 110. As a result, the test structure 120 is suitable for serving as an early indicator of device integrity before a comprehensive testing is conducted in the final stage of fabrication.

Figure 2A:
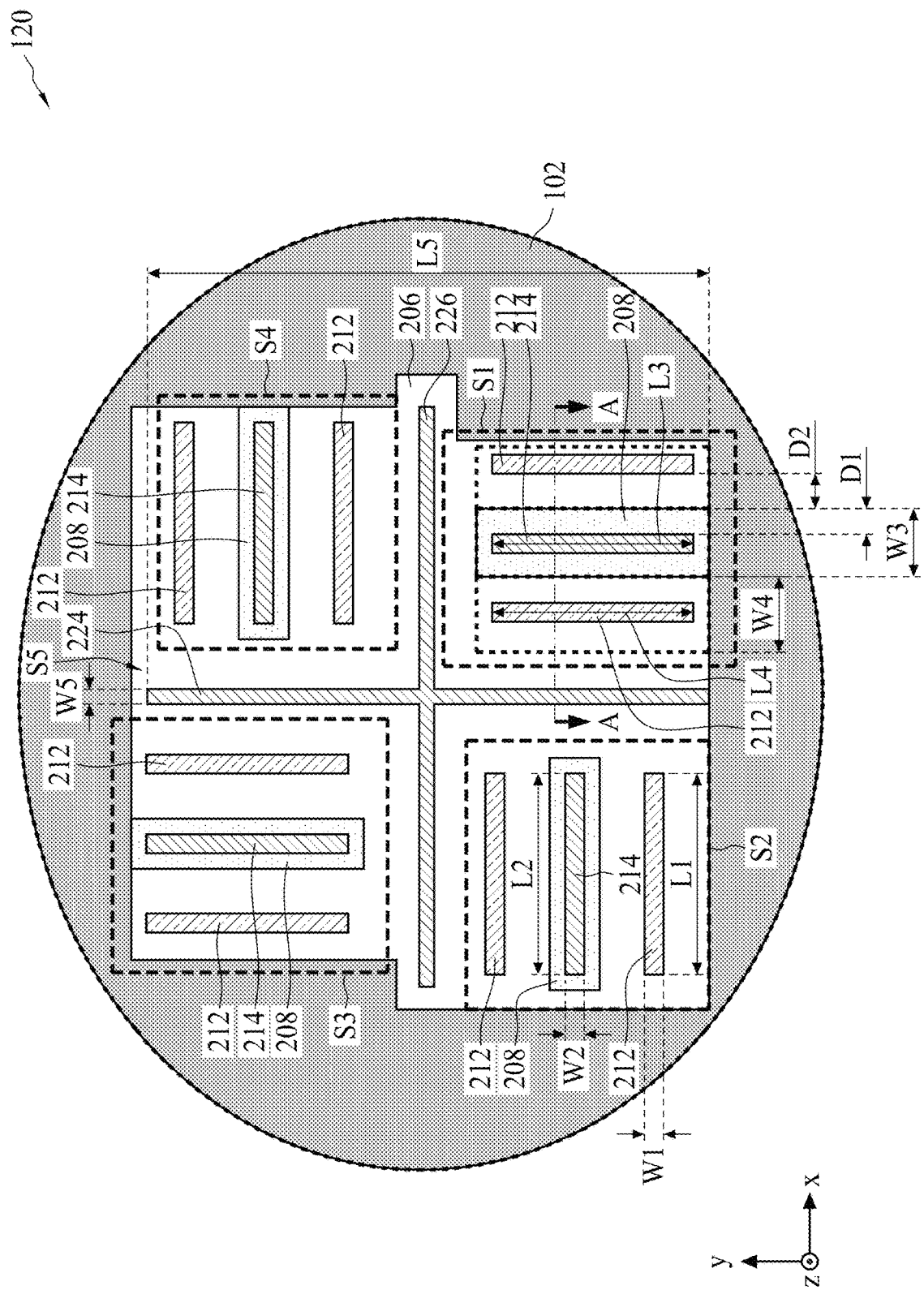
FIG. 2A is a schematic plan view of an enlarged view of a test structure in the semiconductor wafer shown in FIG. 1, in accordance with some embodiments.
Figure 2B:
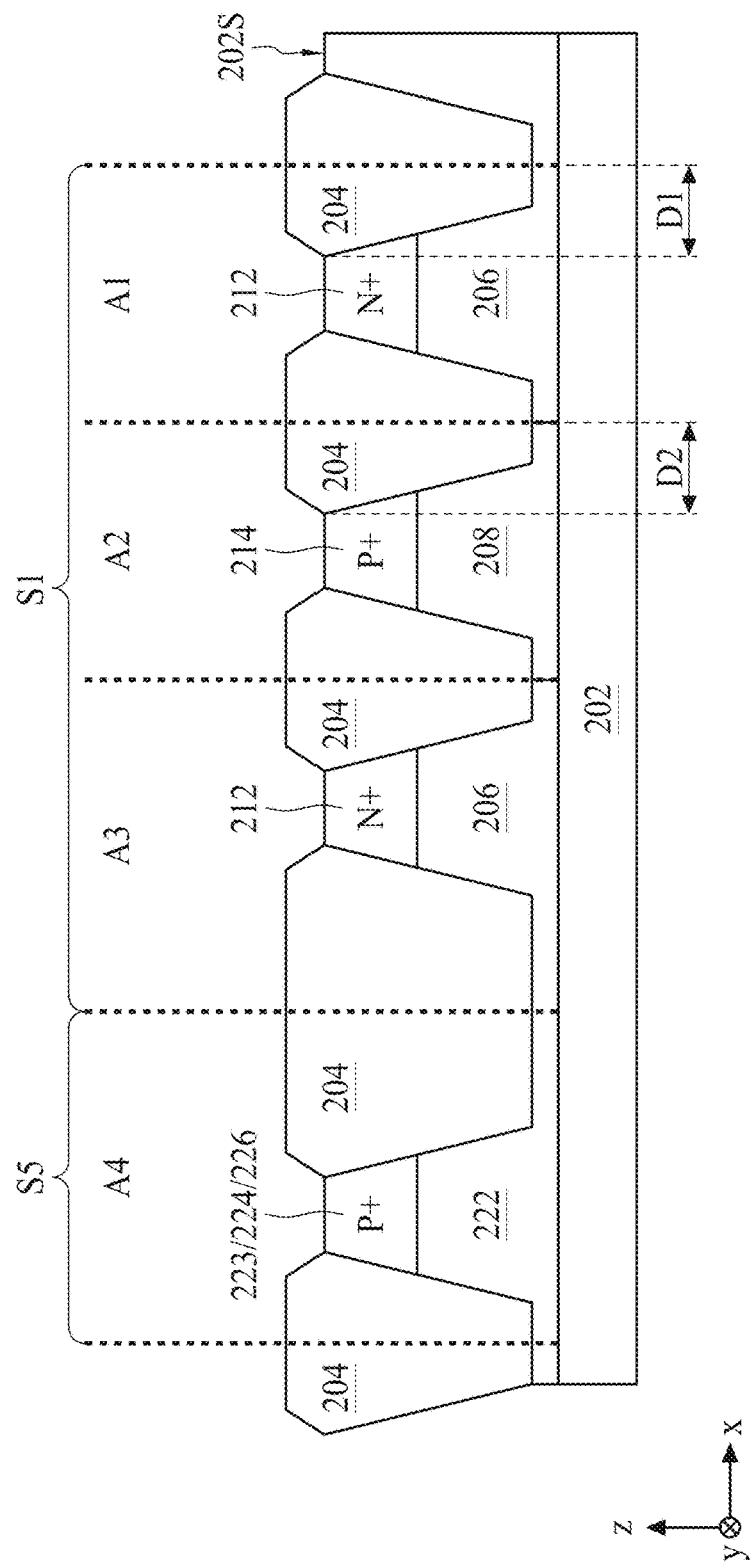
FIG. 2B is a cross-sectional view of the test structure shown in FIG. 2A, in accordance with some embodiments.

FIG. 2A is a schematic plan view showing an enlarged view of the test structure 120, in accordance with some embodiments. FIG. 2B is a cross-sectional view of the test structure 120 taken along a section line AA in FIG. 2A. For illustrative purposes, only part of the features of the test structure 120 are shown in FIG. 2A, and some features, e.g., shallow trench isolation (STI) 204 which are illustrated only in FIG. 2B, are omitted from FIG. 2A in order not to obscure the underlying features.

Referring to FIG. 2A, the test structure 120 includes a first set S1, a second set S2, a third set S3, a fourth set S4 and a fifth set S5. The sets S1, S2, S3, S4 and S5 are formed on a substrate 202 and arranged adjacent to each other.

The substrate 202 is formed of a semiconductor material, such as silicon. In an embodiment, the substrate 202 may include other semiconductor materials, such as silicon germanium, silicon carbide, gallium arsenide, or the like. The substrate 202 may be a P-type semiconductor substrate (acceptor type) or an N-type semiconductor substrate (donor type). Alternatively, the substrate 202 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another alternative, the substrate 202 may be a semiconductor-on-insulator (SOI), a doped epitaxial layer, a gradient semiconductor layer, or a semiconductor layer overlaying another semiconductor layer of a different type, such as a silicon layer on a silicon germanium layer.

Referring to FIG. 2B, a plurality of isolation regions, e.g., the STIs 204 are formed on the substrate 202. The STIs 204 define a plurality of areas A1, A2, A3 and A4 and provide electrical isolation between the adjacent areas A1 through A4. The areas A1, A2 and A3 correspond to the first set S1 and the area A4 corresponds to the fifth set S5. In some embodiments, each of the STI 204 has a top surface protruding from the upper surface 202S of the substrate 202. In some embodiments, the STIs 204 are formed of dielectric materials, such as silicon oxide. However, other suitable dielectric materials, such as silicon nitride, silicon carbide or silicon oxynitride may be additionally or alternatively used in the STIs 204.

In the present embodiment, each of the sets S1 through S4 includes two P-type well regions 206 and one N-type well region 208 between the P-type well regions 206. However, the test structure 120 of the present disclosure is not limited thereto. Each of the sets S1 through S4 can have an arbitrary number of P-type well regions 206 and an arbitrary number of N-type well regions 208 alternately arranged with the P-type well regions 206. Further, the numbers of the P-type well regions 206 and the numbers of the N-type well regions 208 can vary among the sets S1 through S4. The N-type well region 208 or the P-type well region 206 may be used to simulate a functional N-type or P-type well region of the semiconductor devices 110 in the device region 104.

The P-type well regions 206 and the N-type well region 208 are defined and laterally surrounded by their adjacent STIs 204. In some embodiments, the P-type well region 206 or the N-type well region 208 has a bottom portion lower than a lower surface of the STIs 204. In some embodiments, the P-type well region 206 or the N-type well region 208 has a lower portion extending below the lower surface of the STI 204. In some embodiments, a P-type well region 206 may contact an N-type well region 208 in the respective lower portions beneath the STI 204.

In some embodiments, the P-type well region 206 is a doped region including P-type dopants, wherein the dopants may include P-type impurities, e.g., boron or indium. In some embodiments, the N-type well region 208 is a doped region including N-type dopants, wherein the dopants may include N-type impurities, e.g., phosphorus, arsenic or antimony. In some embodiments, the doping concentrations of the P-type well region 206 or the N-type well region 208 are in a rage between about $1\times10^{16}$ and $5\times10^{18}$ cm$^{-3}$.

An N-type active region 212 is formed on an upper portion of the respective P-type well region 206. Similarly, a P-type active region 214 is formed on an upper portion of the respective N-type well region 208. The N-type active region 212 or the P-type active region 214 may be used to simulate a functional N-type or P-type active region of the semiconductor devices 110 in the device region 104, in which the functional active region is used to form a source region, a drain region and a channel region of a field-effect transistor (FET). In some embodiments, the N-type active region 212 is a doped region including N-type dopants. In some embodiments, the P-type active region 214 is a doped region including P-type dopants.

Referring to FIG. 2A, in some embodiments, the N-type active region 212 has an elongated shape extending in the direction parallel to the x-axis or the y-axis in order to better simulate the counterpart P-type active regions of the semiconductor devices 110. In some embodiments, the N-type active region 212 has a strip shape from a top-view perspective and includes a length L1 measured along the x-axis (or y-axis) and a width W1 measured along the y-axis (or x-axis). In some embodiments, an aspect ratio between the length L1 and the width W1 is between about 3 and about 20, or between about 5 and about 10.

Similarly, the P-type active region 214 has an elongated shape extending in the direction parallel to the x-axis or the y-axis in order to better simulate the counterpart P-type active regions of the semiconductor devices 110. In some embodiments, the P-type active region 214 has a strip shape from a top-view perspective and includes a length L2 measured along the x-axis (or y-axis) and a width W2 measured along the y-axis (or the x-axis). In some embodiments, an aspect ratio between the length L2 and the width W2 is between about 3 and about 20, or between about 5 and about 10.

In some embodiments, the N-type well region 208 is laterally surrounded by more than one P-type well region 206. The N-type well region 208 has an elongated shape extending in the direction parallel to the x-axis or the y-axis in order to better simulate the counterpart N-type well regions of the semiconductor devices 110. In some embodiments, the N-type well region 208 has a strip shape from a top-view perspective and includes a length L3 measured along the x-axis (or y-axis) and a width W3 measured along the y-axis (or x-axis). In some embodiments, an aspect ratio between the length L3 and the width W3 is between about 2 and about 20, or between about 3 and about 10.

Similarly, although not shown in FIG. 2A, the P-type well region 206 may be laterally surrounded by more than one N-type well regions 208. In this scenario, the P-type well region 206 has an elongated shape extending in the direction parallel to the x-axis or the y-axis in order to better simulate the counterpart P-type well regions of the semiconductor devices 110. In some embodiments, the P-type well region 206 has a strip shape from a top-view perspective and includes a length L4 measured along the x-axis (or y-axis) and a width W4 measured along the y-axis (or x-axis). In some embodiments, an aspect ratio between the length L4 and the width W4 of the P-type well region 206 is between about 2 and about 20, or between about 3 and about 10.

Referring to FIG. 2B, in some embodiments, the P-type well region 206 has a lower portion extending below the STI 204. In some embodiments, the extended lower portion of the P-type well region 206 aids in providing sufficient breakdown voltage together with the overlying N-type active region 212. In some embodiments, a lateral distance D1 between a side of the N-type active region 212 and a side of the P-type well region 206 is between about 1 nm and about 10 nm.

Similarly, in some embodiments, the N-type well region 208 has a lower portion extending below the STI 204. In some embodiments, the extended lower portion of the N-type well region 208 aids in providing sufficient breakdown voltage together with the overlying P-type active region 214. In some embodiments, a lateral distance D2 between a side of the P-type active region 214 and a side of the N-type well region 208 is between about 1 nm and about 10 nm.

In some embodiments, the length L4 of the P-type well region 206 is substantially equal to the lengths L3 of the N-type well region 208. In some embodiments, for the parallel P-type well region 206 and the N-type well region 208 of the set S1, the upper side of the P-type well region 206 is flush with upper side of the N-type well region 208, and the lower side of the P-type well region 206 is flush with the lower side of the N-type well region 208.

In some embodiments, the length L1 of the N-type active region 212 is have substantially equal to the length L2 of the P-type active region 214, and the width W1 of the N-type active region 212 is have substantially equal to the width W2 of the P-type active region 214. In some embodiments, the upper side of the N-type active region 212 in the set S1 is flush with upper side of the P-type active region 214, and the lower side of the N-type active region 212 is flush with the lower side of the P-type active region 214.

In some embodiments, a pitch between the parallel P-type well region 206 and the N-type well region 208 is substantially equal to the width W3 of the N-type well region 208 or the width W4 of the P-type well region 206. In some embodiments, a pitch of the parallel P-type well regions 206 is substantially equal to a pitch of the parallel N-type well region 208. In some embodiments, the width W3 is substantially equal to the width W4.

In some embodiments, the set S1 and the set S3 have identical circuit patterns from a top-view perspective. In some embodiments, the set S2 and the set S4 have identical circuit patterns from a top-view perspective. In some embodiments, the test structure 120 is formed of a plurality of sets S1, S2, S3, S4 and S5, in which the sets S1, S2, S3 and S4 form a grid separated by the set S5. In some embodiments, the sets S1 and S3 (or the sets S2 and S4) that have identical circuit patterns are arranged in different rows and different columns of the grid. In some embodiments, the test structure 120 includes a plurality of rows and a plurality of columns, where each row or column is formed of a plurality of first sets alternately with a plurality of second sets. In some other embodiments, each row or column is formed of multiple sets, in which the multiple sets have different circuit patterns and are alternately arranged in one row or column. In some embodiments, any one of the circuit patterns of the sets S1, S2, S3 and S4 can be derived from another set S1, S2, S3 and S4 by a rotation with an angle, e.g., ninety degrees or any other degrees. For example, the sets S1 and S2 are different by a rotation angle of ninety degrees.

In some embodiments, the fifth set S5 includes a P-type well region 222 arranged in the area A4 of the scribe line region 106 over the substrate 202. The fifth set S5 further includes a strip 224 of a P-type pickup region 223, which is a P-type doped region, arranged over the P-type well region 222. In some embodiments, the P-type pickup region 223 includes one or more elongated portions 224, 226 extending in different directions. For example, the P-type pickup region includes only one strip 224 or 226, or the P-type pickup region may include the strips 224 and 226 substantially perpendicular to each other. In some embodiments, the strip 224 crosses the strip 226 such that the P-type pickup region 223 forms a cross shape. In some embodiments, the fifth set S5, including the P-type well region 222 and the P-type pickup region 223, is arranged in the midst of the four sets S1 through S4. In some embodiments, the strip 224 extends between the sets S1 and S2 or between the sets S3 and S4 while the strip 226 extends between the sets S1 and S4 or between the sets S2 and S3.

The depicted embodiments illustrates the fifth set S5 formed of the P-type well region 222 and the P-type pickup region 223. However, the test structure 120 of the present disclosure is not limited thereto. The fifth set S5 may also be formed of an N-type well region and an N-type pickup region with a strip or cross shape.

Referring to FIG. 2A, in some embodiments, the strip 224 or 226 has an elongated shape extending in the direction parallel to the x-axis or the y-axis. In some embodiments, the strip 224 or 226 includes a length L5 measured along the x-axis (or y-axis) and a width W5 measured along the y-axis (or x-axis). In some embodiments, an aspect ratio between the length L5 and the width W5 is between about 10 and about 30, or between about 15 and about 20.

The aforesaid N-type active regions 212, P-type active region 214 or the P-type pickup region 223 may have greater doping concentrations than those of their respective P-type or N-type well regions 206, 208, 222. In some embodiments, the doping concentrations of the N-type active region 212, P-type active region 214 and the P-type pickup region 223 are in a rage between about $1 \times 10^{18}$ and $5 \times 10^{20}$ cm$^{-3}$.

Figure 3A:
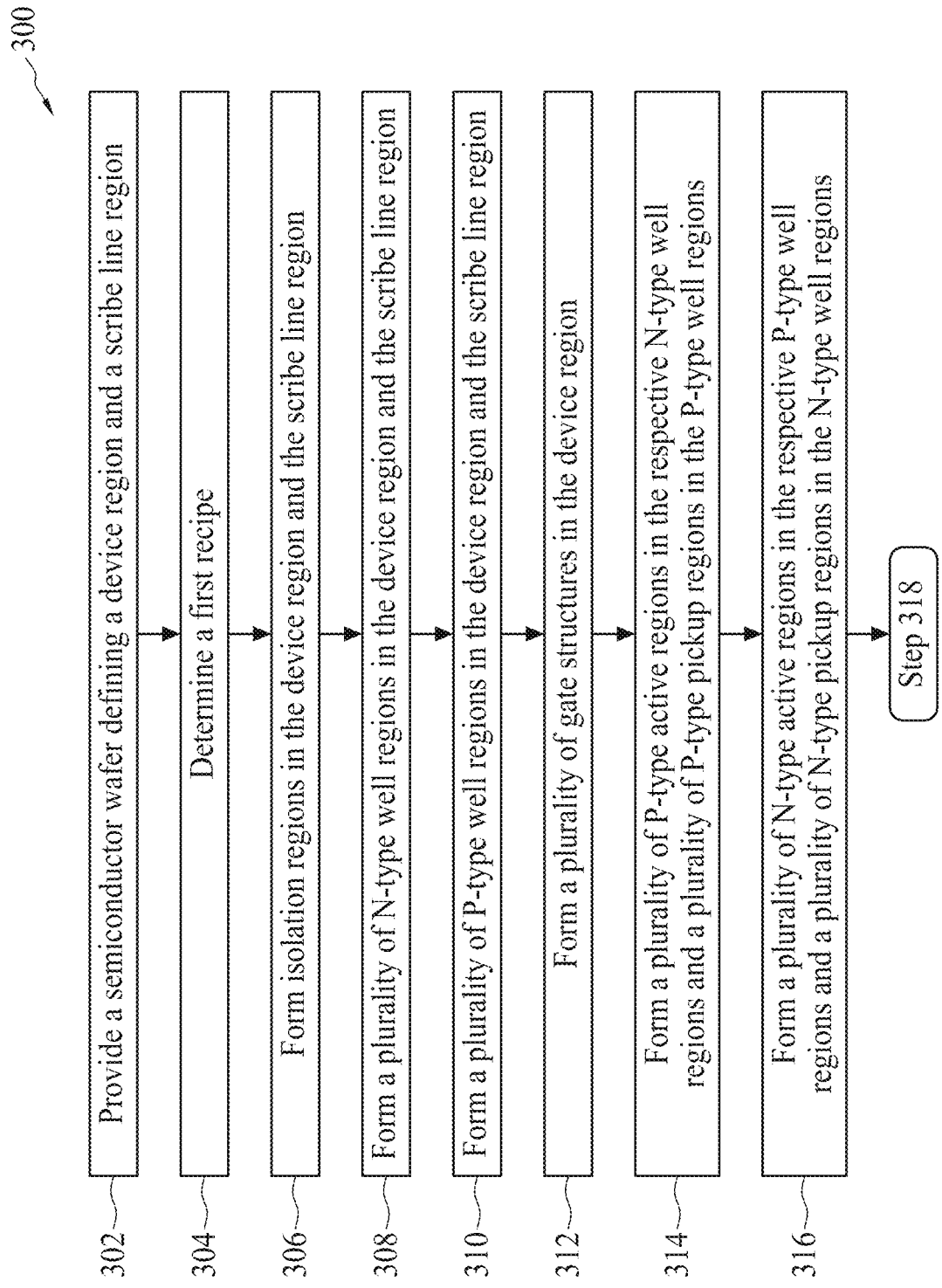
FIGS. 3A and 3B show a flowchart of a method of manufacturing and testing a semiconductor wafer, in accordance with some embodiments.
Figure 3B:
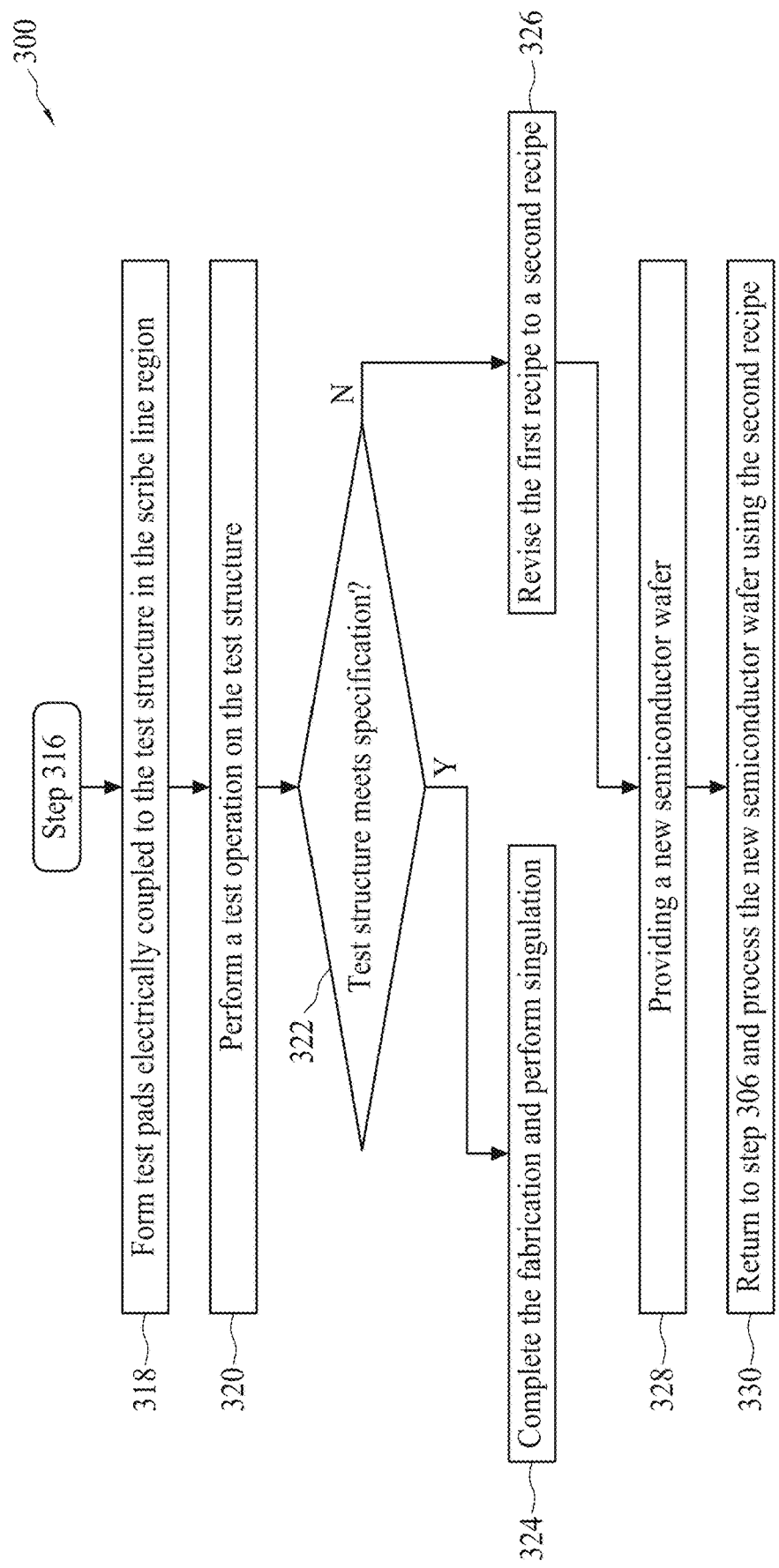

FIGS. 3A and 3B show a flowchart of a method 300 of manufacturing and testing a semiconductor wafer 400, in accordance with some embodiments. FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A and 17B are schematic cross-sectional views showing intermediate stages of the method 300, in accordance with some embodiments. It should be understood that additional steps can be provided before, during, and after the steps shown in the method 300, and some of the steps described below can be replaced or eliminated, for additional embodiments of the method 300. The order of the steps may be changed. Materials, configurations, dimensions, processes and/or operations the same as or similar to those described with respect to the foregoing embodiments may be employed in the following embodiments, and the detailed explanation thereof may be omitted.

The semiconductor wafer 400 defines a plurality of device regions 400A and a scribe line region 400B in a manner similar to that illustrated in FIG. 1. The figure number appended with a letter "A" shows the device region 400A of the semiconductor wafer 400 and the figure number appended with a letter "B" shows the scribe line region 400B of the semiconductor wafer 400. For example, an exemplary semiconductor device in the device region 400A and an exemplary test structure in the scribe line region 400B are illustrated in FIG. 4A and FIG. 4B, respectively. The plan views of the features shown in the following figures are similar to those shown in FIG. 2A.

Referring to step 302 and FIGS. 4A and 4B, a semiconductor wafer 400 is provided or formed. The semiconductor wafer 400 may include the substrate 202.

Figure 17A:
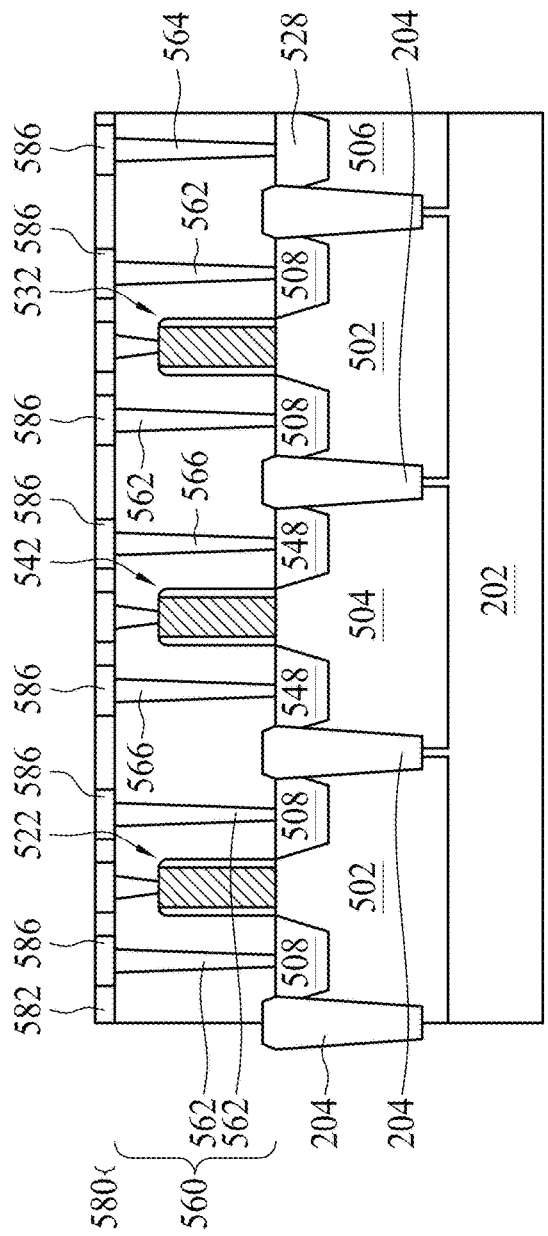

Referring to step 304, a first recipe is determined. The first recipe may include implantation parameters such as tilt angle, implantation dose, implant period, implant energy, and the like. In some embodiments, the first recipe includes a rotation angle of the semiconductor wafer 400. Referring to FIG. 17A, a plan view of the semiconductor wafer 400 is shown. An angle mark M1 is formed on the semiconductor wafer 400 to indicate the rotation angle of the semiconductor wafer 400 in the xy-plane. In some embodiments, the angle mark M1 is aligned with an angle reference R1 of the wafer stage to indicate the current rotation angle of the semiconductor wafer 400. In some embodiments, the first recipe includes different parameters for an N-type doped region and a P-type doped region. In some embodiments, the first recipe includes different parameter settings for a well region, an active region and a pickup region.

Referring to step 306 and FIGS. 4A and 4B, a plurality of isolation regions 204 are formed in the substrate 202 across the device region 400A and the scribe line region 400B. In some embodiments, the isolation regions 204 are STIs. The isolation regions 204 may define the N-type well regions and the P-type well regions, both in the device region 400A and the scribe line region 400B. In some embodiments, the isolation regions 204 are formed of dielectric materials, such as silicon oxide, silicon nitride, silicon oxynitride, or other suitable dielectric materials. In some embodiments, the isolation regions 204 are formed by etching trenches in the substrate 202 and performing deposition operations to fill the trenches with the dielectric materials. In some embodiments, the isolation regions 204 have upper portions protruding from the upper surface of the substrate 202. In some other embodiments, the isolation regions 204 are level with the upper surface of the substrate 202, e.g., by a planarization operation such as chemical mechanical planarization (CMP), grinding, or other etching methods.

Figure 5A:
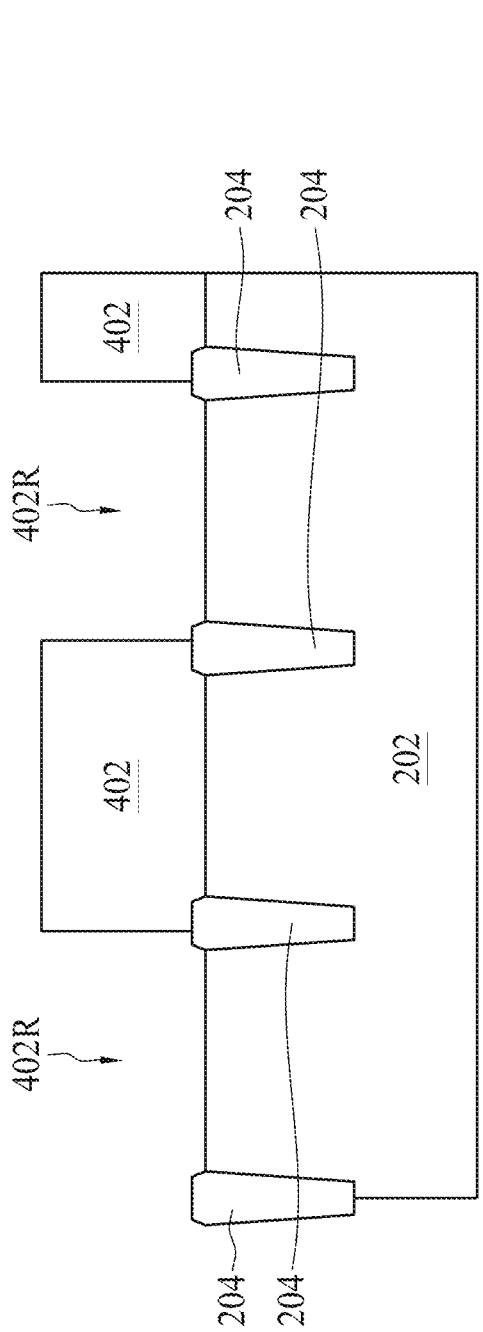
Figure 5B:
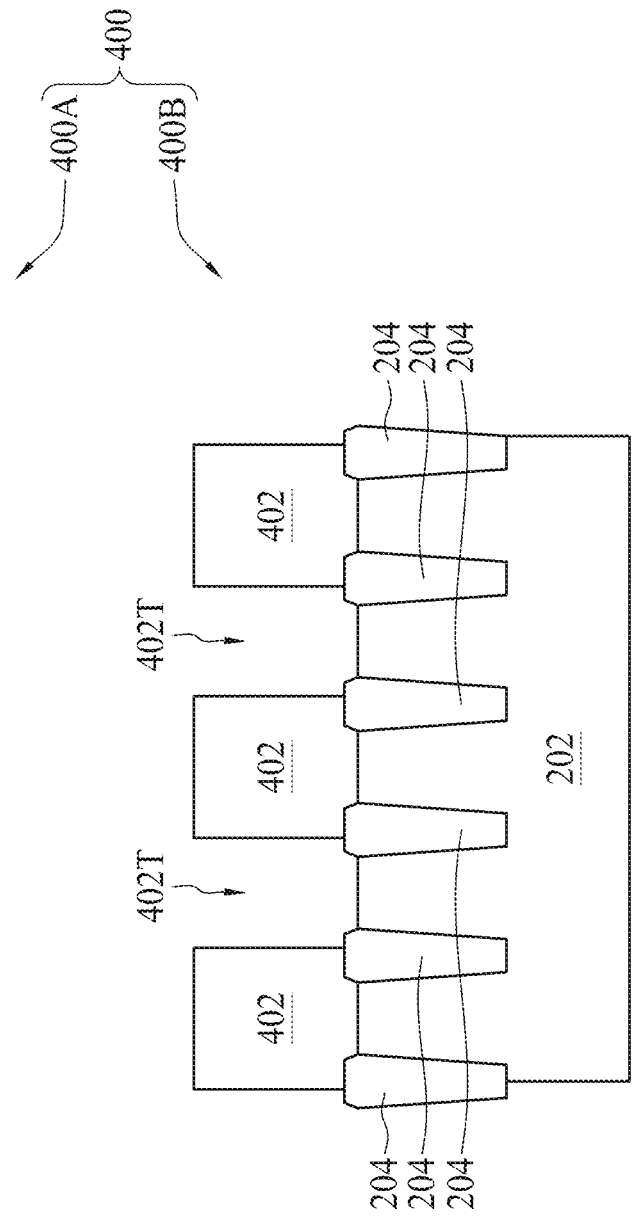

Referring to step 308, a plurality of N-type well regions 502 and 512 are formed in the device region 400A and the scribe line region 400B, respectively. Referring to FIGS. 5A and 5B, a mask layer 402 is deposited over the substrate 202 across the device region 400A and the scribe line region 400B. The mask layer 402 may be formed of a photosensitive material, such as a photoresist, or a dielectric material, such as silicon oxide, silicon nitride, or other suitable materials. The mask layer 402 may be deposited by physical vapor deposition (PVD), chemical vapor deposition (CVD), atomic layer deposition (ALD), thermal oxidation, thermal nitridation, spin coating, or other suitable deposition methods.

The mask layer 402 is patterned to form openings exposing areas 402R and 402T of the substrate 202 for the subsequently formed N-type well regions while covering the areas for other regions. Referring to FIGS. 2A, 5A and 5B, the mask layer 402 may be configured to form openings which expose the areas 402R in the device region 400A and the areas 402T in the scribe line region 400B. The patterning operation of the mask layer 402 may be performed by photolithography and etching operations. In some embodiments, the etching operation may include a dry etch, a wet etch, or a combination thereof, e.g., reactive ion etch (RIE), or the like.

In some embodiments, the areas 402T are formed according to the strip shapes of the N-type well regions 208 in the sets S1 through S5 and extend in a direction of the x-axis or the y-axis. The areas 402R and 402T may have substantially identical dimensions and geometries such that the test structure formed in the scribe line region 400B may simulate the performance of the semiconductor devices in the device region 400A. Therefore, the circuit pattern of each of the sets S1 through S5 formed in the scribe line region 400B may have a corresponding circuit pattern in the device region 400A. Although FIGS. 4A and 4B only show that the areas 402R or 402T are parallel and extend in one direction, e.g., in the y-axis, in a manner similar to the configurations of the N-type well regions 208 in the set S1 of FIG. 2A, the areas 402R or 402T can also additionally or alternatively include strips that extend in another direction, e.g., in the x-axis, in a manner similar to the configurations of the N-type well region 208 in the set S2 of FIG. 2A. As a result, the areas 402R or 402T may include at least part of the strips of the N-type well regions 208 that extend in different directions.

Referring to FIGS. 6A and 6B, an ion implantation operation IM1 is performed to form the N-type well regions 502 and 512 in the device region 400A and the scribe line region 400B, respectively. N-type dopants are implanted into the predetermined areas 402R and 402T with the mask layer 402 serving as the implantation mask. During the first ion implantation operation IM1, the N-type dopants may be injected downwardly to a level substantially level with the bottom surface of the isolation region 204. The ion implantation operation IM1 may be conducted according to the first recipe. In some embodiments, according to the first recipe, the ion implantation operation IM1 performs one injection with a tilt angle T1 of the implanter and a rotation angle A1 of the semiconductor wafer. The tilt angle T1 may be in a range between about 5° and about 60°. In some embodiments, the rotation angle A1 is zero degrees with the angle mark M1 pointing to the positive y-axis direction.

Figure 7A:
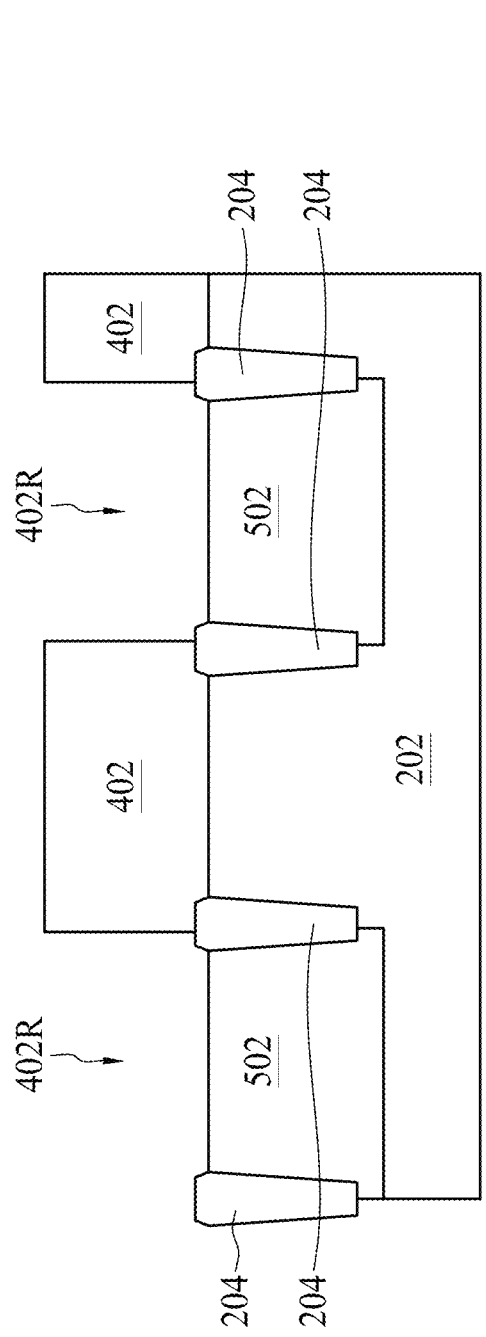
Figure 7B:
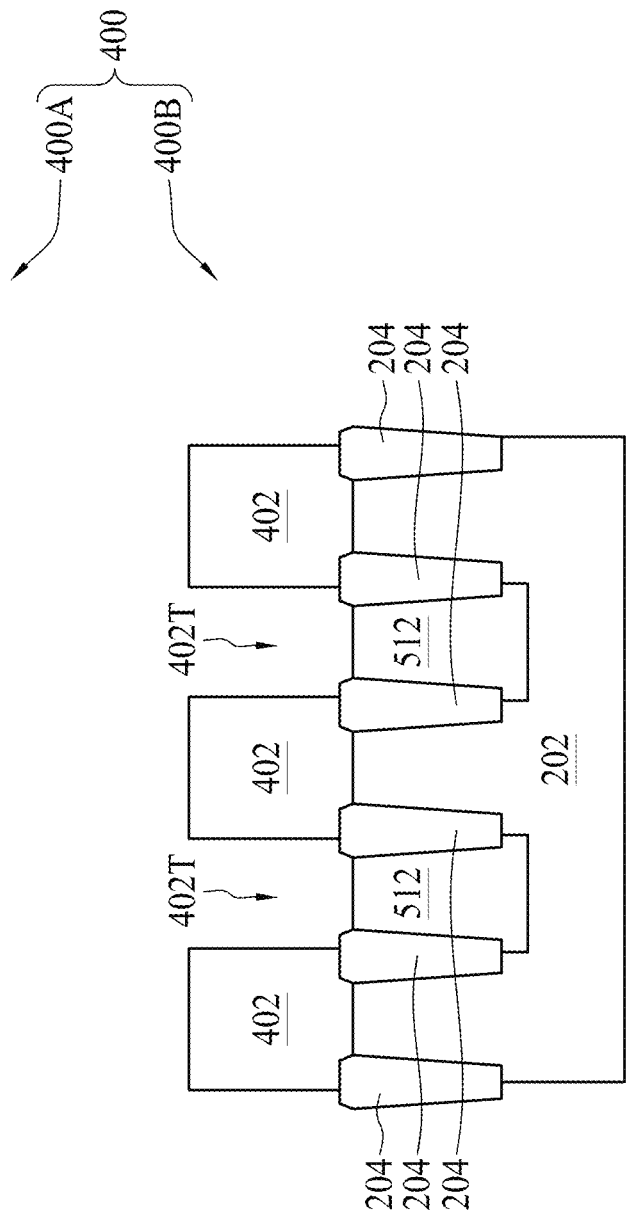

Referring to FIGS. 7A and 7B, a thermal or annealing operation is performed to activate the dopants in the N-type well regions 502 and 512. Through the thermal operation, the dopants of the N-type well regions 502 and 512 are driven to diffuse further downwardly. The annealed N-type well regions 502 and 512 may include bottom sides lower than the bottom surfaces of the isolation regions 204 and extending below the bottom surfaces of the isolation regions 204. In some embodiments, the thermal operation is performed in which an annealing temperature is in a rage between about 200° C. and about 500° C., e.g., 400° C. In some embodiments, after the formation of the N-type well regions 502 and 512 the mask layer 402 is removed or stripped. The removal of the mask layer 402 may be performed by an etching or asking operation.

Figure 8A:
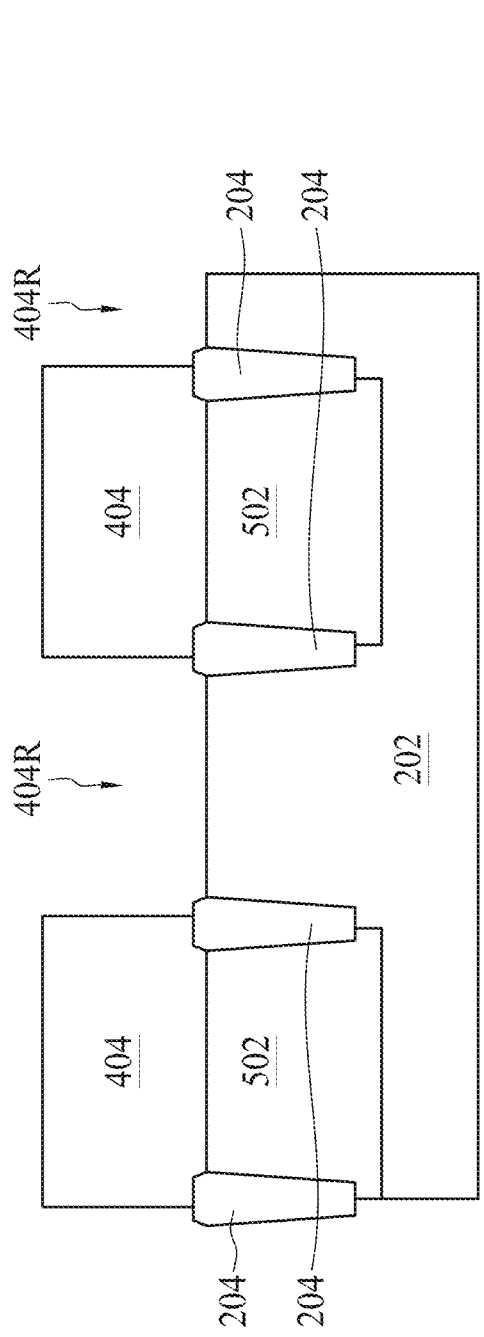
Figure 8B:
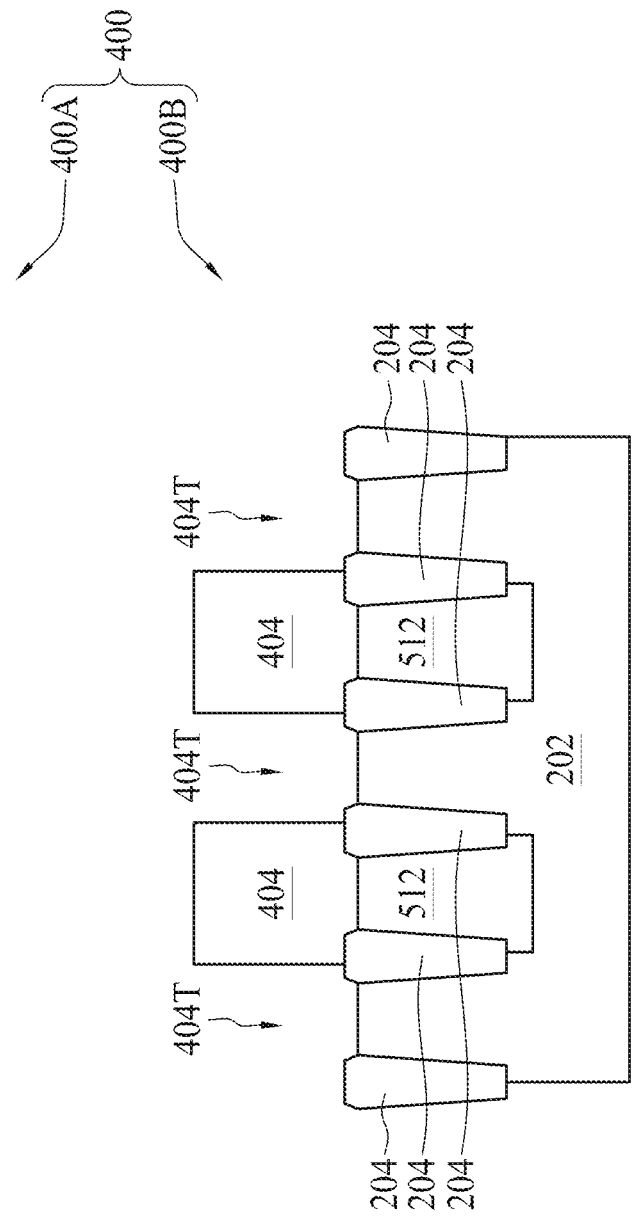

Referring to step 310 and FIGS. 8A, 8B, 9A and 9B, a plurality of P-type well regions 504 and 514 are formed in the device region 400A and the scribe line region 400B, respectively, in a manner similar to that shown with reference to step 308. For example, as shown in FIGS. 8A and 8B, a mask layer 404 is deposited over the substrate 202 and patterned to expose areas 404R and 404T of the substrate 202 for the subsequently formed P-type well regions while covering the remaining areas. The material, configuration, and method of forming and patterning of the mask layer 404 are similar to those of the mask layer 402. Referring to FIGS. 2A, 8A and 8B, the mask layer 404 may be configured to form openings which expose the areas 404R and 404T according to the strip shapes of the P-type well regions 206 in the sets S1 through S5 and extend in the x-axis or the y-axis.

Figures 9A, 9B:
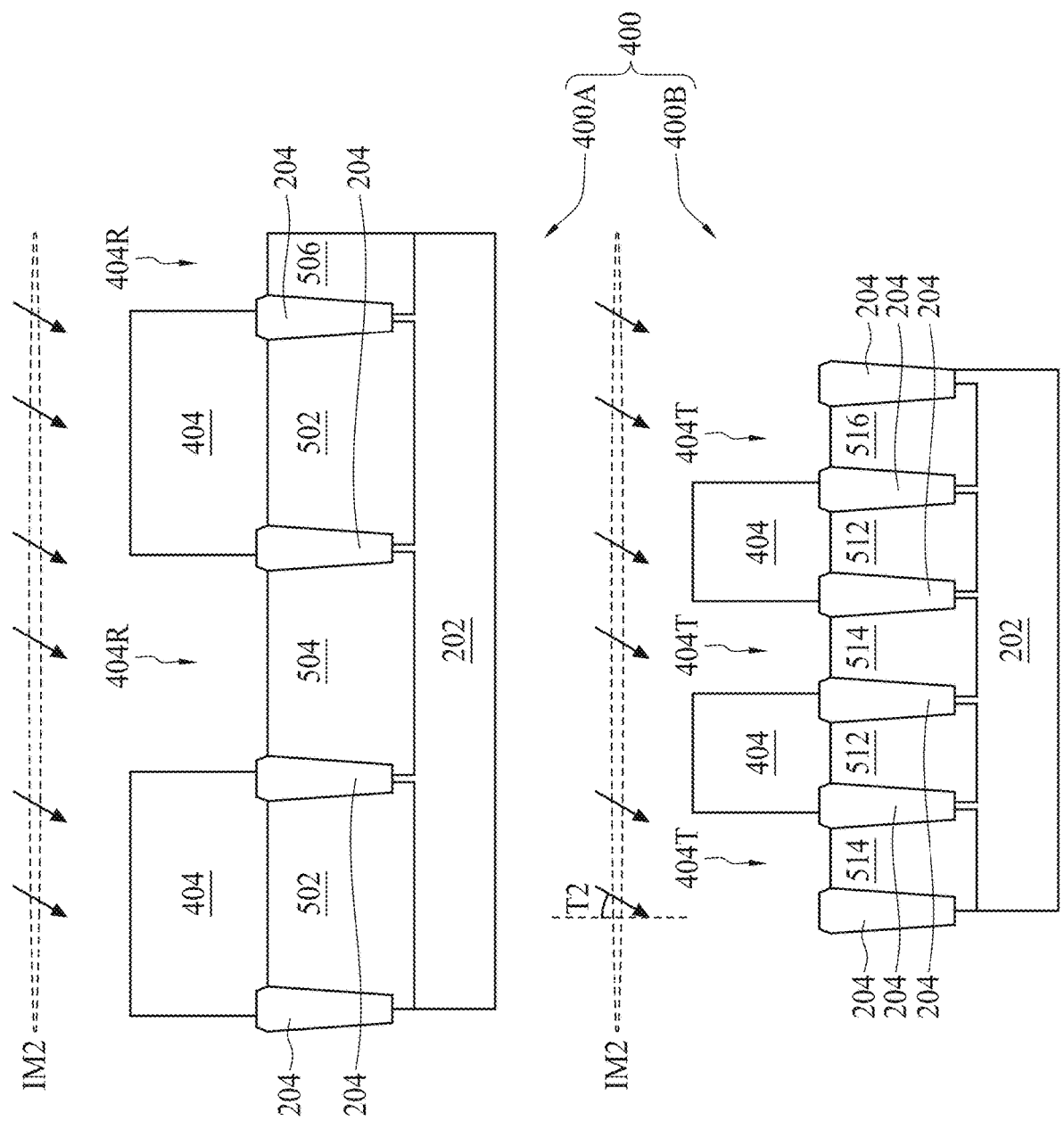

Referring FIGS. 9A and 9B, an ion implantation operation IM2 is performed to form P-type well regions 504 and 506 in the device region 400A and P-type well regions 514 and 516 in the scribe line region 400B. The ion implantation operation IM2 may be conducted according to the first recipe. In some embodiments, according to the first recipe, the ion implantation operation IM2 performs one injection with a tilt angle T2 and of the implanter a rotation angle A2 of the semiconductor wafer 400. The tilt angle T2 may be in a range between about 5° and about 60°. In some embodiments, the rotation angle A2 is zero degrees with the angle mark M1 pointing to the positive y-axis direction.

In some embodiments, a thermal operation is performed to activate the dopants of the P-type well regions 504, 506, 514 and 516. In some embodiments, the thermal operation is performed in which an annealing temperature is in a rage between about 200° C. and about 500° C., e.g., 400° C.

Figures 10A, 10B:
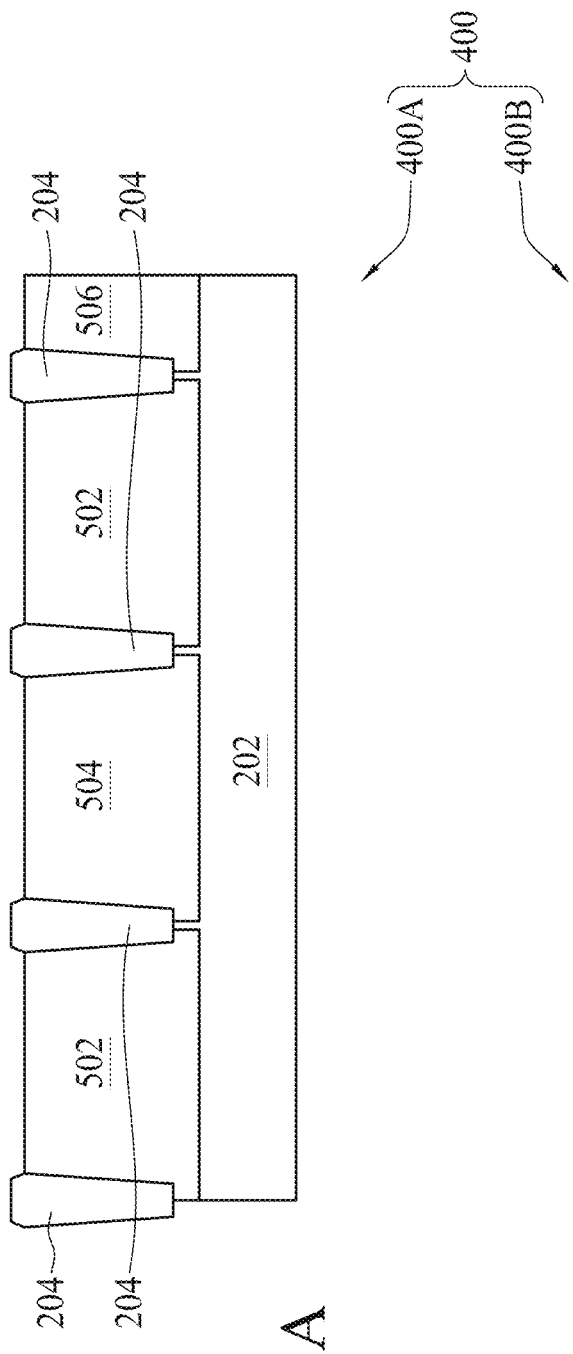

Referring to FIG. 10A and FIG. 10B, in some embodiments, after the formation of the P-type well regions 504, 506, 514 and 516 is completed, the mask layer 404 is removed or stripped.

Figures 11A, 11B:
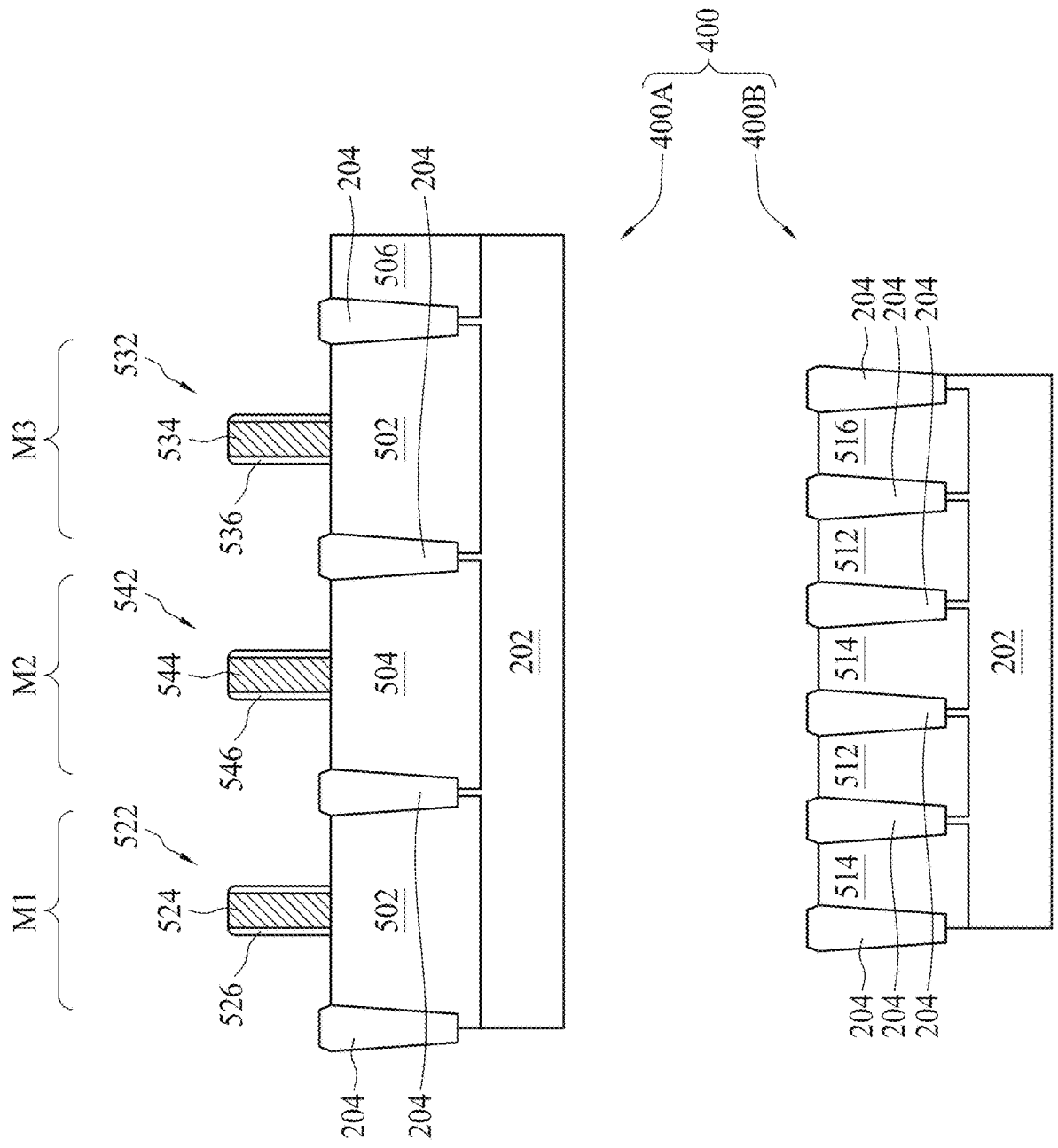
Figure 12A:
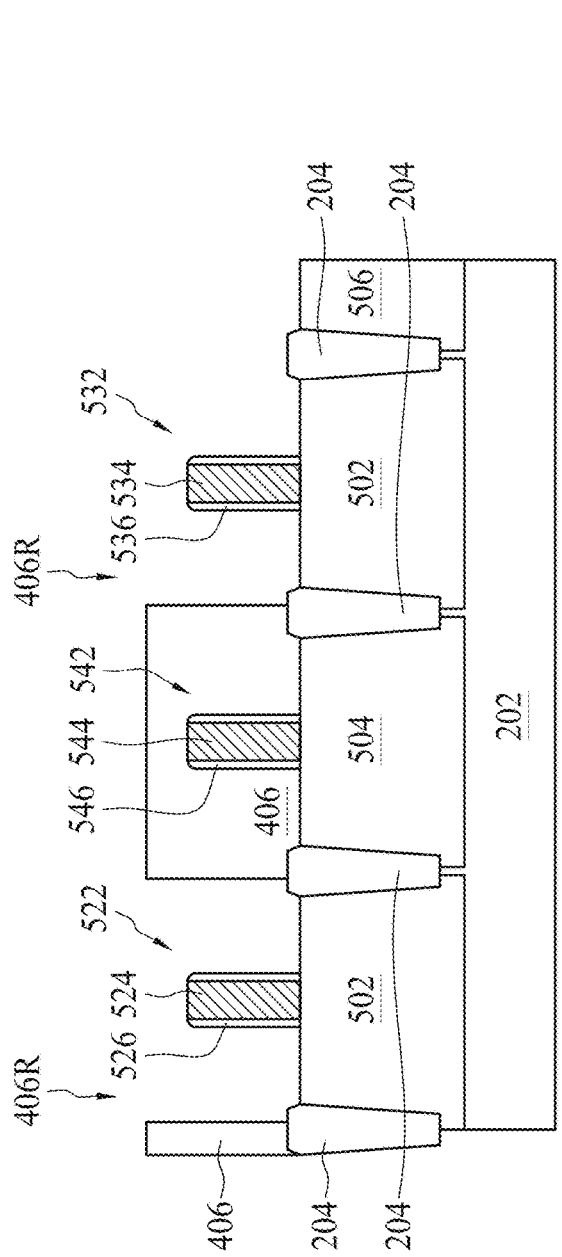
Figure 12B:
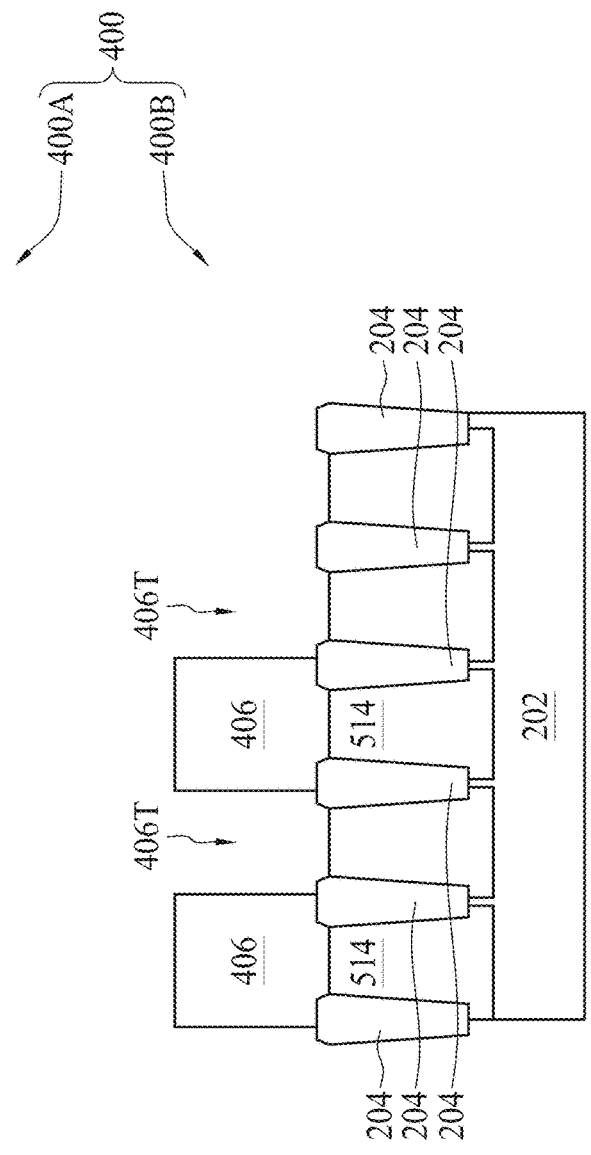

Referring to step 312 and FIGS. 11A and 11B, transistors M1, M2 and M3 are formed in the device region 400A. Gate structures 522, 532, 542 are formed over the substrate 202 in the device region 400A. In some embodiments, gate electrodes 524, 534, 544 are formed of a conductive material, such as doped polysilicon or metallic materials. In some embodiments, the gate electrodes 524, 534, 544 are doped with N type dopants or P-type dopants. In some embodiments, gate electrodes 524, 534, 544 serve as sacrificial gates. The gate electrodes 524, 534, 544 may be formed by initially depositing one or more conductive layers over the substrate, followed by patterning the conductive layers to form the gate electrodes 524, 534 and 544.

Gate spacers 526, 536 and 546 are formed on sidewalk of the respective gate electrodes 524, 534, 544. In some embodiments, the gate spacers 526, 536, 546 laterally surround the respective gate electrodes 524, 534, 544 and define the boundaries of the active regions of the respective transistors M1 through M3 with the adjacent isolation regions 204. In some embodiments, the gate spacers 526, 536, 546 are formed of dielectric materials, such as oxide, nitride, carbide, oxynitride, and the like. The gate spacers 526, 536, 546 may be formed by depositing one or more dielectric layers on the gate electrodes 524, 534, 544 in a conformal manner by CVD, PVD, ALD, and etching the horizontal portions of the dielectric layers, thereby exposing the upper surface of the substrate 202 and the upper surfaces of the gate electrodes 524, 534, 544 and leaving the vertical portions as the gate spacers 526, 536, 546.

In some embodiments, the gate structures 522, 532 and 542 further include gate dielectric layers formed on the substrate 202 prior to the formation of the gate electrodes 524, 534, 544. The gate dielectric layers may be patterned and arranged between the substrate 202 and the respective gate electrodes 524, 534, 544 and laterally surrounded by the respective gate spacers 526, 536, 546. In some embodiments, the gate dielectric layers are formed of dielectric materials, such as oxide, nitride, carbide, oxynitride, high-k dielectric materials and the like.

In some embodiments, the gate structures are absent from the scribe line region 400B. In some embodiments, the test structures in the scribe line region 400B are configured to simulate the electrical performance of the well regions 502, 504 and the subsequently formed active regions. Therefore, the gate structures may be omitted in the scribe line region 400B for saving cost and time.

Referring to step 314 and FIGS. 12A, 12B, 13A and 13B, a plurality of P-type active regions are formed in the respective N-type well regions 502, 512. Likewise, a plurality of P-type pickup regions are formed in the respective P-type well regions 506, 516. Initially, referring to FIGS. 12A and 12B, a mask layer 406 is deposited over the substrate 202 across the device region 400A and the scribe line region 400B. The mask layer 406 may be formed in a manner similar to that of the mask layer 404. The mask layer 406 is patterned to expose the areas 406R and 406T of the substrate 202 for the N-type well regions 502 and 512 and the P-type well regions 506 and 516 while covering the areas for the P-type well regions 504 and 514.

Figure 13A:
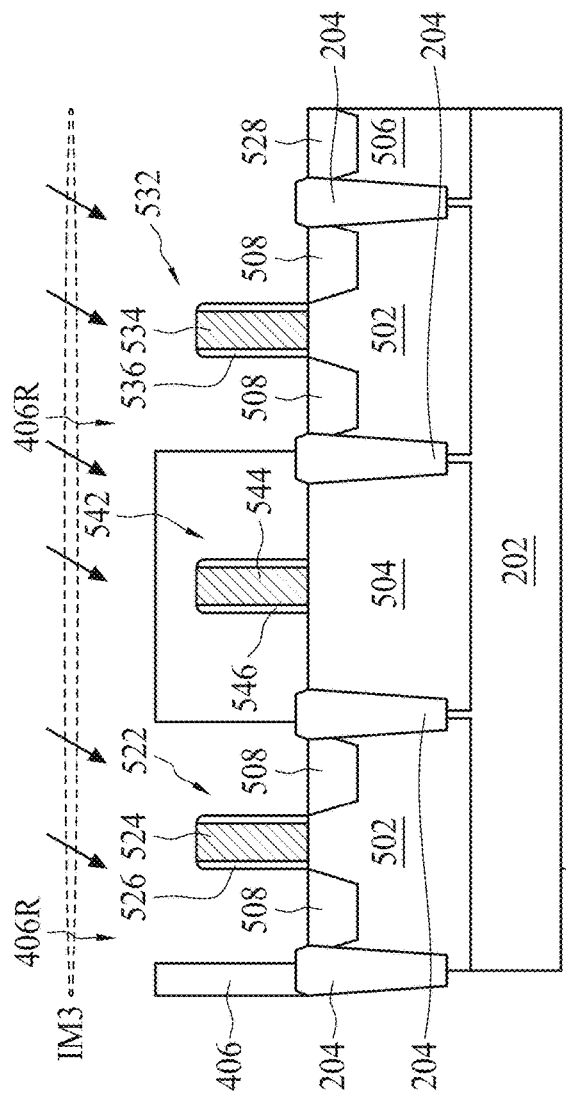
Figure 13B:
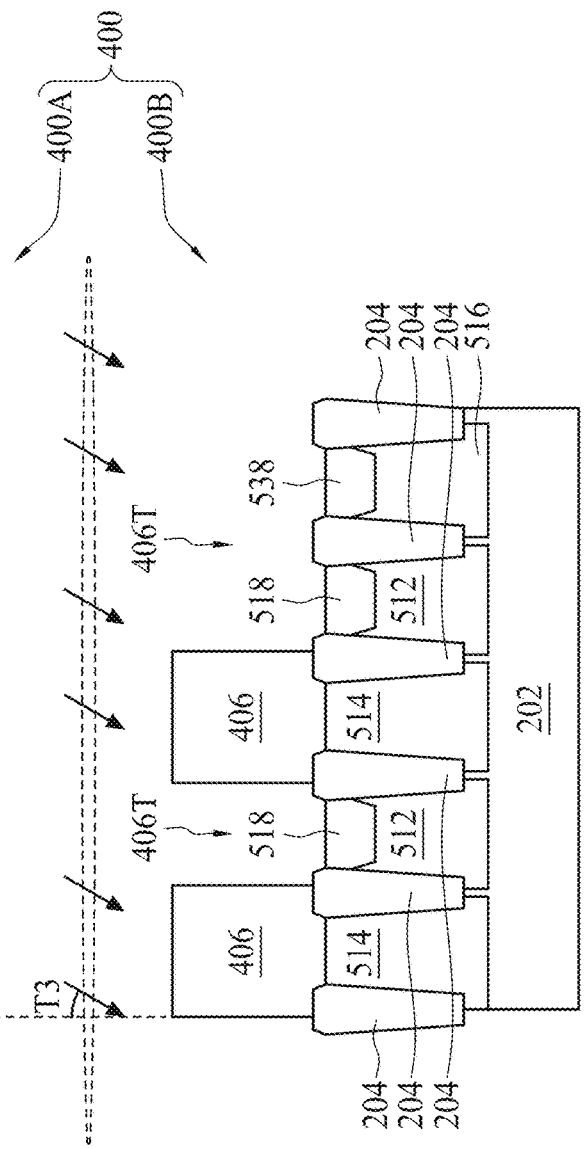
Figures 14A, 14B:
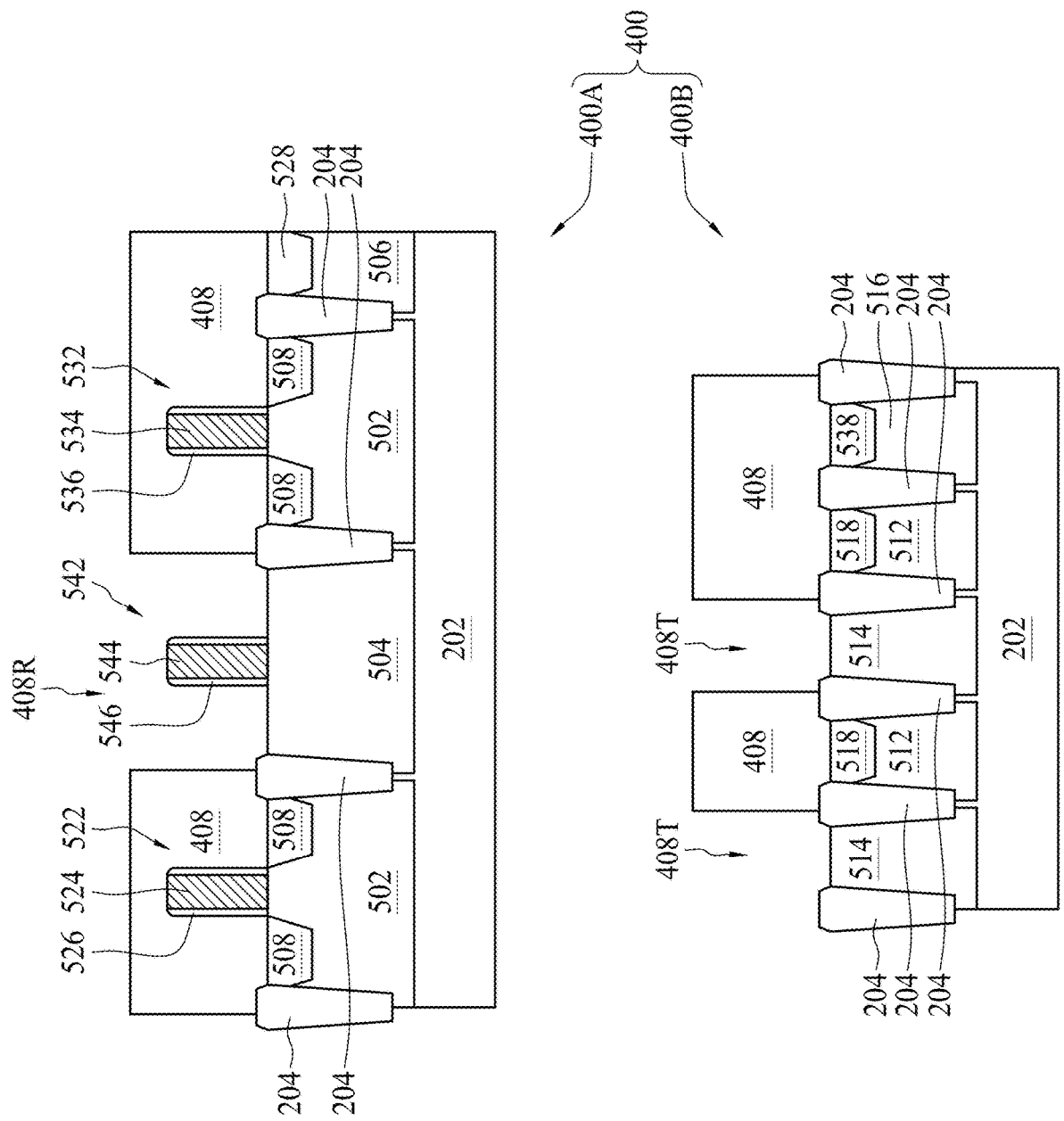

Referring to FIGS. 13A and 13B, an ion implantation operation IM3 is performed to form P-type active regions 508 and 518 in the device region 400A and the scribe line region 400B, respectively. P-type dopants are implanted into the areas 406R and 406T of the substrate 202 for forming the P-type active regions 508 and 518 with the mask layer 406, the gate structures 522, 532 and the isolation regions 204 serving as the implantation mask. The ion implantation operation IM3 may be conducted according to the first recipe. In some embodiments, according to the first recipe, the ion implantation operation IM3 performs one injection with a tilt angle T3 of the implanter and a rotation angle A3 of the semiconductor wafer 400. The tilt angle T3 may be in a range between about 5° and about 60°. In some embodiments, the rotation angle A3 is zero degrees with the angle mark M1 pointing to the positive y-axis direction.

In some embodiments, during the ion implantation operation IM3, P-type pickup regions 528 and 538 are also formed in the P-type well regions 506 and 516, respectively. The P-type pickup regions 528 and 538 are formed in upper portions of the P-type well regions 506, 516 of the same conductivity type for reduce electrical resistance of the P-type well regions 506, 516.

In some embodiments, a thermal or annealing operation is performed to activate the dopants in the P-type doped regions 508, 518, 528 and 538. In some embodiments, the thermal operation is performed in which an annealing temperature is in a rage between about 200° C. and about 500° C., e.g., 400° C. In some embodiments, after the formation of the P-type well regions 508, 518, 528 and 538 the mask layer 406 is removed or stripped.

In the depicted embodiments, the P-type doped regions 508, 518, 528 and 538 are formed during the same ion implantation operation IM3. In some other embodiments, the P-type active regions 508, 518 and the P-type pickup regions 528, 538 are formed through independent ion implantation operations with separate implantation mask layers, and the order of forming these P-type doped regions can be exchanged.

Referring to step 316 and FIGS. 14A, 14B, 15A and 15B, a plurality of N-type active regions are formed in the respective P-type well regions 504, 514. Likewise, a plurality of N-type pickup regions are formed in the respective N-type well regions. Initially, referring to FIGS. 14A and 14B, a mask layer 408 is deposited over the substrate 202 across the device region 400A and the scribe line region 400B. The mask layer 408 is patterned to expose the areas 408R and 408T of the substrate 202 for the P-type well regions 504 and 514 while covering the remaining areas.

Figures 15A, 15B:
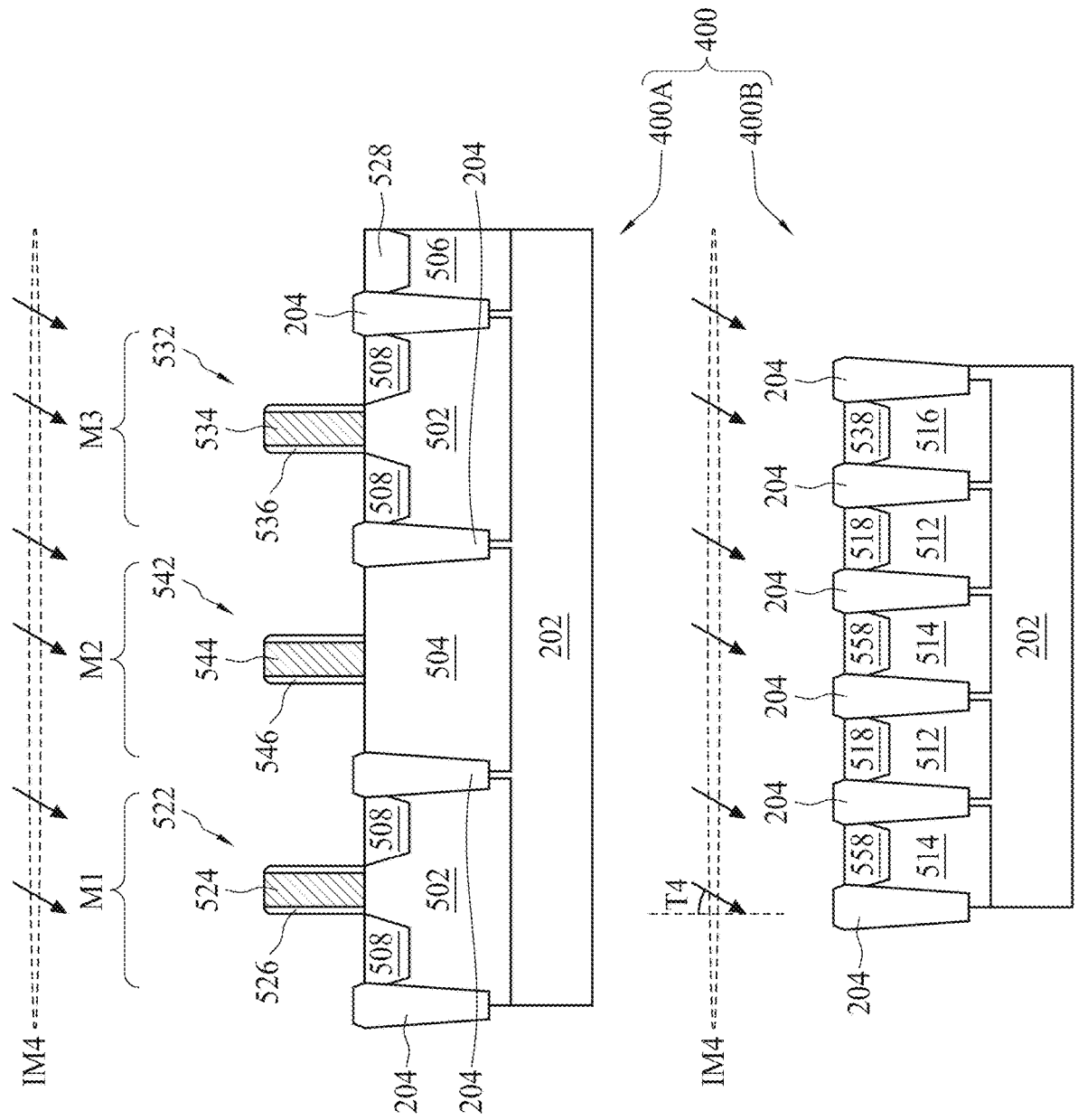

Referring to FIGS. 15A and 15B, an ion implantation operation IM4 is performed to form N-type active regions 548 and 558 in the device region 400A and the scribe line region 400B, respectively. N-type dopants are implanted into the areas 408R and 480T for forming the N-type active regions 548 and 558 with the mask layer 408, the gate structure 542 and the isolation regions 204 serving as the implantation mask. The ion implantation operation IM4 may be conducted according to the first recipe. In some embodiments, according to the first recipe, the ion implantation operation IM4 performs one injection with a tilt angle T4 of the implanter and a rotation angle A4 of the semiconductor wafer 400. The tilt angle T4 may be in a range between about 5° and about 60°. In some embodiments, the rotation angle A4 is zero degrees with the angle mark M1 pointing to the positive y-axis direction.

In some embodiments, during the ion implantation operation IM3, N-type pickup regions (not shown) are also formed in the respective N-type well regions of the device region 400A and the scribe line region 400B, respectively. In some embodiments, a thermal or annealing operation is performed to activate the dopants in the N-type doped pickup regions.

The P-type transistor M1 is formed in the device region 400A and includes the gate structure 522, an N-type well region 502 and the P-type active regions 508 within the N-type well region 502. Similarly, the N-type transistor M2 is formed in the device region 400A and includes the gate structure 532, the P-type well region 504 and the N-type active regions 548 within the P-type well region 504. The P-type transistor M3 is formed in the device region 400A and includes the gate structure 542, another N-type well region 502 and the P-type active regions 508 within the N-type well region 502. In some embodiments, the scribe line region 400B is free from any functional transistors.

Figures 16A, 16B:
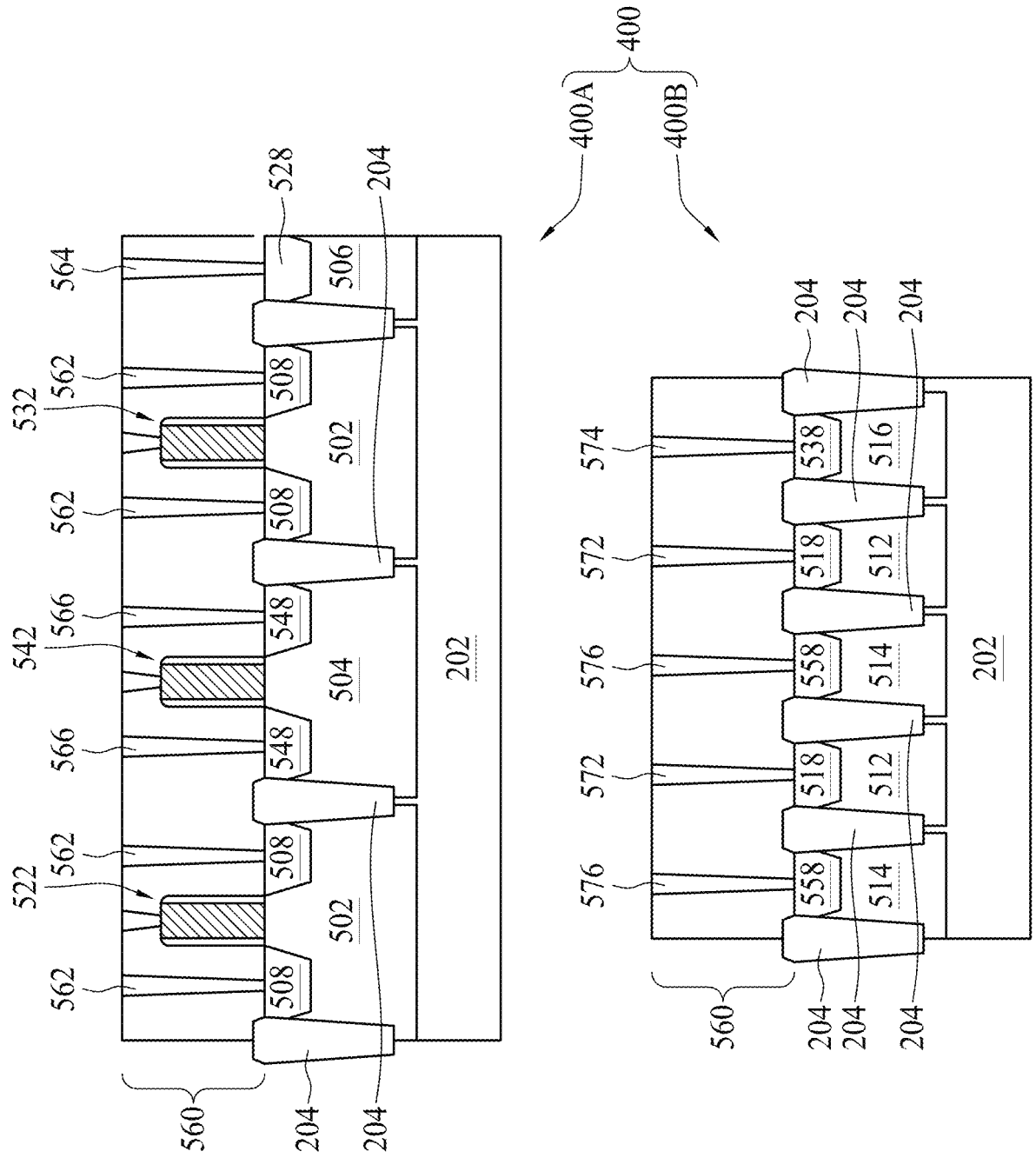

Referring to step 318 and FIGS. 16A, 16B, 17A and 17B, a plurality of test pads are formed to electrically couple to the test structure in the scribe line region 400B. Referring to FIGS. 16A and 16B, an interlayer dielectric (ILD) layer 560 is deposited over the substrate 202 and the gate structures 522, 532, 542. The ILD layer 560 may be formed of a dielectric layer, such as silicon oxide, silicon nitride, or the like, by CVD, PVD, ALD, spin coating, or other suitable deposition methods.

Conductive vias 562, 564, 572, 574 are formed in the ILD layer 560 to electrically couple to the respective P-type active regions 508, 518 and the respective P-type pickup regions 528 and 538. Similarly, conductive vias 566, 576 are formed in the ILD layer 560 to electrically couple to the respective N-type active regions 548, 558. In some embodiments, the conductive vias 562, 564, 566, 572, 574, 576 are formed of conductive materials, such as tungsten, titanium, aluminum, tantalum, gold, silver, alloys thereof, of the like.

Figure 17B:
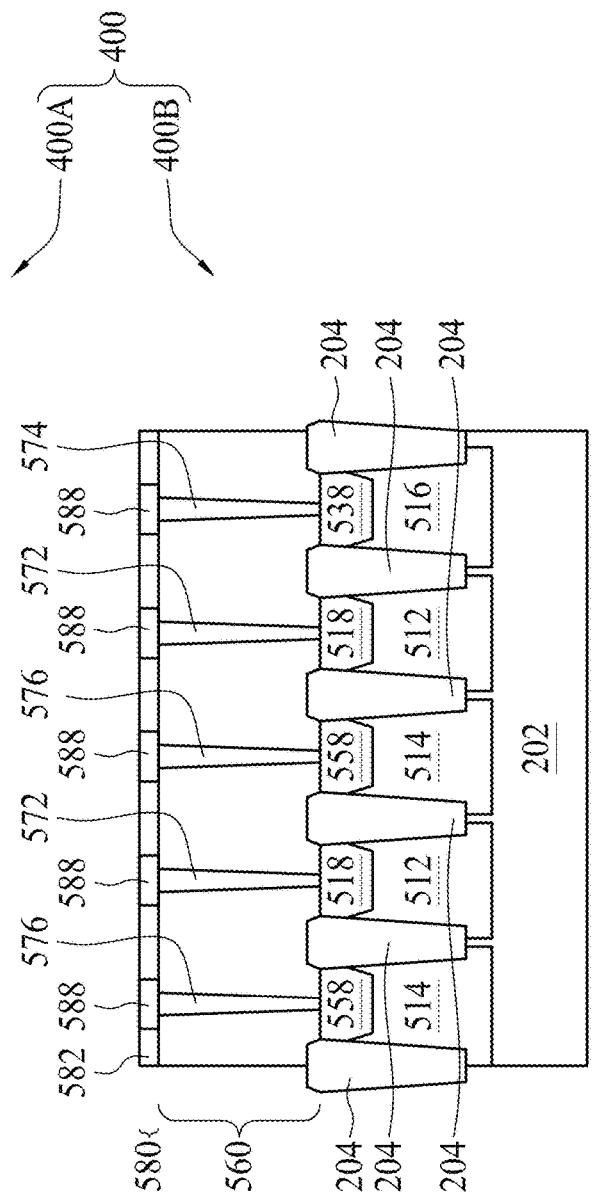

Referring to FIGS. 17A and 17B, a metallization layer 580 is formed over the ILD layer 560. A dielectric layer 582 formed of a dielectric material is deposited over the ILD layer 560. The dielectric material of the dielectric layer 582 may include silicon oxide and/or silicon nitride, and may be deposited by CVD, PVD, ALD, spin coating, or other suitable deposition methods.

The dielectric layer 582 is patterned and conductive pads 586 and 588 are formed in the patterned dielectric layer 582 to electrically couple to the corresponding conductive vias 562, 564, 566, 572, 574, 576. In some embodiments, the conductive pads 586 formed in the device region 400A are used as functional pads to electrically couple to the transistors M1, M2 and M3, while the conductive pads 586 formed in the scribe line region 400B are used as test pads. In some embodiments, the conductive pads 586, 588 are formed of conductive materials, such as tungsten, titanium, aluminum, tantalum, gold, silver, alloys thereof, of the like.

Referring to step 320, a test operation is performed on the test structure. In some embodiments, a wafer acceptance test (WAT) is performed on the test structure in the scribe line region 400B for determining the electrical or physical properties of the test structure. In some embodiments, a circuit probe (CP) board is utilized to perform the test. One or more test patterns or signals are provided to the test pads 588 through the CP board to examine the performance of the well regions 512, 514, 516, the active regions 518, 558, and the pickup region 538, which regions are indicative of the performance of the counterpart well regions 502, 504, 506, the active regions 508, 548 and the pickup region 528. In some embodiments, a breakdown voltage of the transistors M1, M2 and M3 are examined through a test operation on the well regions 512, 514, 516 and the active regions 518, 558 as well as the pickup region 538.

At step 322, it is determined whether the test structure successfully meets the design specification. If affirmative, it is determined that the electrical performance of the well regions and active regions in the transistors M1, M2 and M3 meets the design specification according to the test results of their counterpart features in the test structures. The method 300 will proceed to continue with the remaining fabrication operations until the whole semiconductor devices are completed. In some embodiments, a singulation operation is performed to separate the completed semiconductor devices in the device region 400A into individual dies through cutting through the scribe line region 400B. The test structures in the scribe line region 400B may be removed during the singulation operation.

Figure 18B:
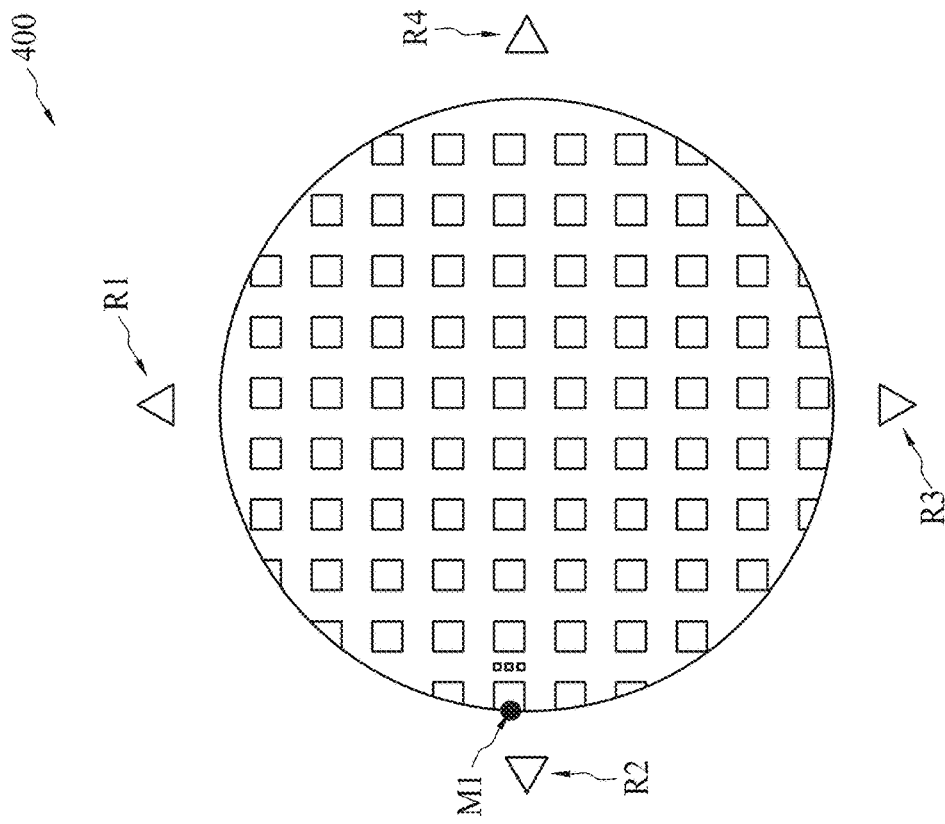
FIGS. 18A and 18B are plan views of a semiconductor wafer in different rotation angles, in accordance with some embodiments.
Figure 18A:
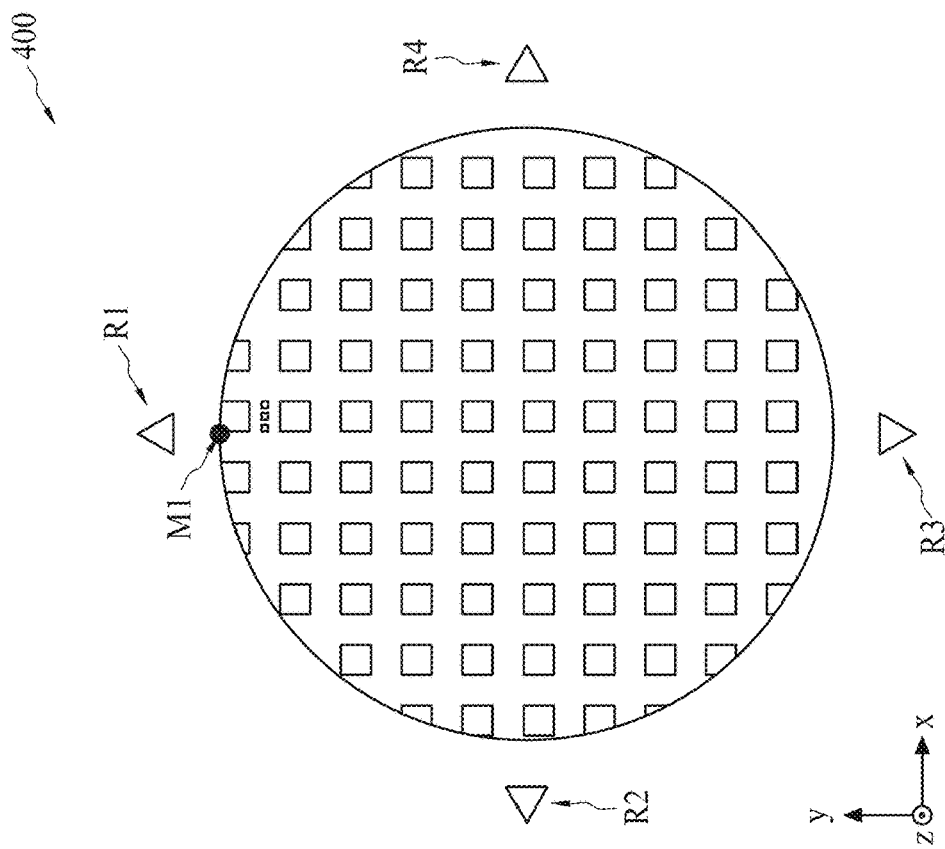

In some embodiments, the test structure may not meet the design specification. This may be due to that the ion implantation operations M1, M2, M3, and M4 are performed with the nonzero tilt angles A1, A2, A3, and A4. As the device size continues to shrink, the thicknesses of the mask layers 402, 404, 406, 408 may induce a shadow effect which blocks some of the dopants during the tilted ion implantation operation from reaching the desired locations in the substrate 202. At step 326, if it is determined that at least one defect is found in the test structure during the test operation, e.g., the breakdown voltage fails the specification, the first recipe is revised into a second recipe in an attempt to mitigate or reduce the shadow effect. In some embodiments, the second recipe includes an implant dose different from, e.g., greater than, that of the first recipe. In some embodiments, the second recipe includes more than one injections in one ion implantation operation, in which the consecutive injections are conducted to implant the dopants with different rotation angles. Referring to FIG. 18B, a plan view of the semiconductor wafer 400 is shown, in which four reference marks R1, R2, R3 and R4 represent four rotation angles A5 of the semiconductor wafer 400 to be used in one ion implantation operation.

At step 328, a new semiconductor wafer is provided or formed. This new semiconductor wafer has a shape and material similar to the semiconductor wafer 400. At step 330, the new semiconductor wafer is placed on the wafer stage to be processed with the method 300 starting from step 306. The second recipe is adopted to improve the implant performance. For example, during each of the ion implantation operations M1, M2, M3 and M4, the implanter provides more than one (e.g., four) injections, in which the total dose of the multiple injections is substantially equal to the dose of the first recipe. In some embodiments, the dose of each injection is substantially equal to 1/N of the dose in the first recipe, where N represents the injection count in the second recipe. Each injection is performed with different rotation angles A5 of the new semiconductor wafer, e.g., 0°, 90°, 180° and 270° with respect to the positive y-axis. Through the distributed injections with different rotation angles, the impact of the shadow effect caused by the mask layers 402, 404, 406, 408 are reduced, and the resultant profiles of the well regions, active regions and pickup regions may be improved.

According to an embodiment, a method includes: providing a substrate including a scribe line region and a device region adjacent to the scribe line region; depositing a first mask layer over the device region and the scribe line region; patterning the first mask layer to define a plurality of first areas in the device region and a plurality of second areas in the scribe line region, wherein the first areas and the second areas are parallel and extending in a first direction from a top-view perspective; performing a first ion implantation to form first well regions in the first areas and second well regions in the second areas; coupling conductive pads to the second well regions; and performing a test on the second well regions through the conductive pads.

According to an embodiment, a method includes: providing a substrate including a scribe line region and a device region adjacent to the scribe line region; determining a first recipe with a first rotation angle and a first dose; depositing a first mask layer over the device region and the scribe line region; patterning the first mask layer to form first openings in the scribe line region, the first openings exposing a plurality of first areas of the substrate that extend in a first direction; patterning the first mask layer to form second openings in the scribe line region, the second openings exposing a plurality of second areas of the substrate that extend in a second direction different from the first direction; and performing a first ion implantation with the first recipe to form a plurality of first well regions in the respective first areas and a plurality of second well regions in the respective second areas.

According to an embodiment, a method includes: providing a substrate including a scribe line region and a device region adjacent to the scribe line region. The substrate includes a plurality of first well regions of a first conductivity type in the scribe line region and a plurality of second well regions of the first conductivity type in the device region, the first well regions and the second well regions being in parallel along a first direction from a top-view perspective. The substrate also includes a plurality of third well regions of a second conductivity type in the scribe line region and a plurality of fourth well regions of the second conductivity type in the device region, the third well regions and the fourth well regions being in parallel along the first direction from a top-view perspective. The method further includes performing a test operation on the first well regions, second well regions, the third well regions and the fourth well regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate including a scribe line region and a device region adjacent to the scribe line region;
depositing a first mask layer over the device region and the scribe line region;
patterning the first mask layer to define a plurality of first areas in the device region and a plurality of second areas in the scribe line region, wherein the first areas and the second areas are parallel and extending in a first direction from a top-view perspective;
patterning the first mask layer to define third areas within the first areas and fourth areas within the second areas, wherein the third areas and the fourth areas have a strip shape extending in the first direction;
performing a first ion implantation to form first well regions in the first areas and second well regions in the second areas;
coupling conductive pads to the second well regions; and
performing a test on the second well regions through the conductive pads.

2. The method according to claim 1, further comprising patterning the first mask layer to define fifth areas in the device region and alternately arranged with the first areas and sixth areas in the scribe line region and alternately arranged with the second areas, wherein the fifth areas and the sixth areas have a strip shape extending in the first direction.

3. The method according to claim 2, wherein the first areas have a first length measured in the first direction equal to a second length of the fifth areas measured in the first direction.

4. The method according to claim 2, wherein, wherein a pitch between one of the first areas and one of the fifth areas is equal to a width of the one of the first areas.

5. The method according to claim 2, further comprising performing a second ion implantation to form third well regions in the fifth areas and fourth well regions in the sixth areas, wherein the first well regions and the third well regions have different conductivity types.

6. The method according to claim 1, wherein the first well regions and the second well regions are N-type well regions.

7. The method according to claim 1, further comprising performing a third ion implantation to form third active regions in the third areas and fourth active regions in the second areas, wherein the first well regions and the third active regions have different conductivity types.

8. The method according to claim 1, further comprising patterning the first mask layer to define seventh areas in the device region and eighth areas in the scribe line region, wherein the seventh areas and the eighth areas have a strip shape extending in a second direction different from the first direction.

9. The method according to claim 8, wherein the first direction is perpendicular to the second direction.

10. The method according to claim 8, further comprising performing a fourth ion implantation to form fifth well regions in the seventh areas and sixth well regions in the eighth areas, wherein the first well regions and the fifth well regions have a same conductivity type.

11. The method according to claim 10, further comprising patterning the first mask layer to define a ninth area in the device region and a tenth area in the scribe line region, wherein each of the ninth area and the tenth area has a cross shape.

12. The method according to claim 11, wherein the ninth area separates the first areas from the seventh areas.

13. A method, comprising:
providing a substrate including a scribe line region and a device region adjacent to the scribe line region;
determining a first recipe with a first rotation angle and a first dose;
forming isolation regions on a surface of the substrate;
depositing a first mask layer over the device region and the scribe line region subsequent to the forming of the isolation regions;
patterning the first mask layer to form first openings in the scribe line region, the first openings exposing a plurality of first areas of the substrate that extend in a first direction;
patterning the first mask layer to form second openings in the scribe line region, the second openings exposing a plurality of second areas of the substrate that extend in a second direction different from the first direction; and
performing a first ion implantation with the first recipe to form a plurality of first well regions in the respective first areas and a plurality of second well regions in the respective second areas.

14. The method according to claim 13, wherein the first openings and the second openings are defined by the isolation regions.

15. The method according to claim 13, further comprising:
patterning a second mask layer to form third openings in the scribe line region, the third openings exposing a plurality of third areas of the substrate alternately arranged with the first areas; and
performing a second ion implantation with the first recipe to form a plurality of third well regions in the respective third areas, the third well regions having different conductivity types from those of the first well regions.

16. The method according to claim 15, wherein a first width of each of the first areas is substantially equal to a second width of each of the third areas.

17. The method according to claim 13, wherein the first well regions form a first set of a test structure, the second well regions form a second set of the test structure, the method further comprising forming fourth well regions in the substrate as a third set of the test structure and fifth well regions in the substrate as a fourth set of the test structure, wherein the first, second, third, and fourth sets form a grid.

18. A method, comprising:
providing a substrate including a scribe line region and a device region adjacent to the scribe line region, wherein the substrate comprises;
a plurality of first well regions of a first conductivity type in the scribe line region and a plurality of second well regions of the first conductivity type in the device region, the first well regions and the second well regions being in parallel along a first direction from a top-view perspective; and a plurality of third well regions of a second conductivity type in the scribe line region and a plurality of fourth well regions of the second conductivity type in the device region, the third well regions and the fourth well regions being in parallel along the first direction from a top-view perspective;

performing a test operation on the first well regions, second well regions, the third well regions and the fourth well regions; and a plurality of fifth well regions of the first conductivity type in the scribe line region and a plurality of sixth well regions of the first conductivity type in the device region, the fifth well regions and the sixth well regions being in parallel along a second direction, perpendicular to the first direction, from a top-view perspective.

19. The method according to claim 18, wherein the first well regions are alternately arranged with the third well regions.

20. The method according to claim 18, wherein the substrate further comprises:

a plurality of seventh well regions of the second conductivity type in the scribe line region and a plurality of eighth well regions of the second conductivity type in the device region, the seventh well regions and the eighth well regions being in parallel along the second direction from a top-view perspective.

* * * * *